United States Patent
Suzuki et al.

(10) Patent No.: US 9,411,243 B2
(45) Date of Patent: Aug. 9, 2016

(54) IMAGE FORMING APPARATUS HAVING DETACHABLY MOUNTABLE IMAGE FORMING UNIT

(71) Applicant: CANON KABUSHIKI KAISHA, Tokyo (JP)

(72) Inventors: Koichi Suzuki, Yokohama (JP); Yoshitaka Hibi, Mishima (JP); Hironori Kato, Kawasaki (JP); Naoki Inoue, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/601,749

(22) Filed: Jan. 21, 2015

(65) Prior Publication Data
US 2015/0220000 A1 Aug. 6, 2015

(30) Foreign Application Priority Data

Jan. 31, 2014 (JP) ................... 2014-017736
Jan. 31, 2014 (JP) ................... 2014-017737

(51) Int. Cl.
G03G 21/18 (2006.01)
G03F 7/20 (2006.01)

(52) U.S. Cl.
CPC ............ *G03F 7/70141* (2013.01); *G03G 21/18* (2013.01); *G03G 2221/1892* (2013.01)

(58) Field of Classification Search
CPC .............. G03G 15/5033; G03G 21/18; G03G 2221/1892
See application file for complete search history.

(56) References Cited

U.S. PATENT DOCUMENTS

| 5,909,603 | A * | 6/1999 | Suzuki | G03G 21/1882 340/687 |
| 6,311,026 | B1* | 10/2001 | Higeta | G03G 21/1853 399/111 |
| 2001/0051051 | A1* | 12/2001 | Matsumoto | G03G 21/1814 399/13 |
| 2002/0089579 | A1* | 7/2002 | Yamanaka | G03G 15/0194 347/116 |
| 2006/0193647 | A1* | 8/2006 | Asakura | G03G 15/5004 399/13 |
| 2009/0269086 | A1* | 10/2009 | Mikuni | G03G 15/0865 399/12 |

FOREIGN PATENT DOCUMENTS

| JP | 06-003891 A | 1/1994 |
| JP | 06-051551 A | 2/1994 |
| JP | 07-060288 B2 | 6/1995 |
| JP | 10-069203 A | 3/1998 |
| JP | 11-073084 A | 3/1999 |
| JP | 11-258957 A | 9/1999 |

(Continued)

*Primary Examiner* — Sandra Brase
(74) *Attorney, Agent, or Firm* — Fitzpatrick, Cella, Harper & Scinto

(57) ABSTRACT

An image forming apparatus includes a plurality of image forming units that are each configured to be detachably mountable and include an image carrier; an irradiation unit configured to irradiate respective image carriers of the plurality of image forming units with light to form one or more electrostatic latent images along a direction of the rotational driving; a detection unit configured to detect the electrostatic latent images; a determination unit configured to determine mounted states of the plurality of image forming units based on a detection result by the detection unit; and a control unit configured to perform control such that, for each of the image carriers, the electrostatic latent images are not formed on an image carrier in a period in which at least one of the one or more electrostatic latent images is formed on a different image carrier.

30 Claims, 21 Drawing Sheets

(56) References Cited

FOREIGN PATENT DOCUMENTS

| JP | 11-305633 A | 11/1999 |
| JP | 2002-333812 A | 11/2002 |
| JP | 2004-294662 A | 10/2004 |

\* cited by examiner

▨ : ELECTROSTATIC LATENT IMAGE
Vd : PHOTOSENSITIVE MEMBER POTENTIAL
 IN REGION NOT HAVING ELECTROSTATIC LATENT IMAGE
Vl : PHOTOSENSITIVE MEMBER POTENTIAL
 IN REGION HAVING ELECTROSTATIC LATENT IMAGE

F I G. 12
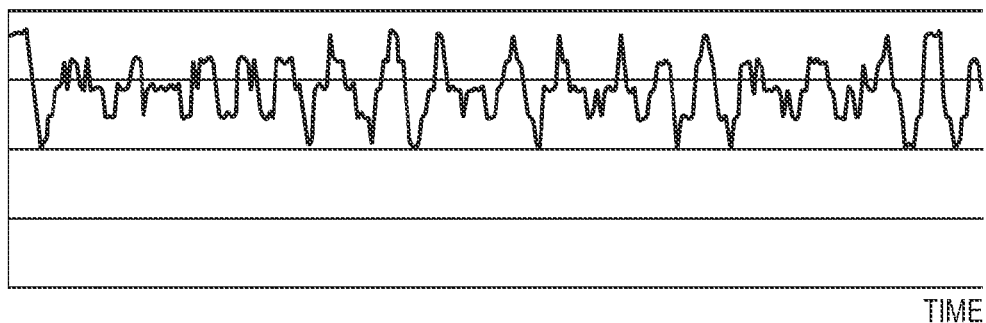
F I G. 13
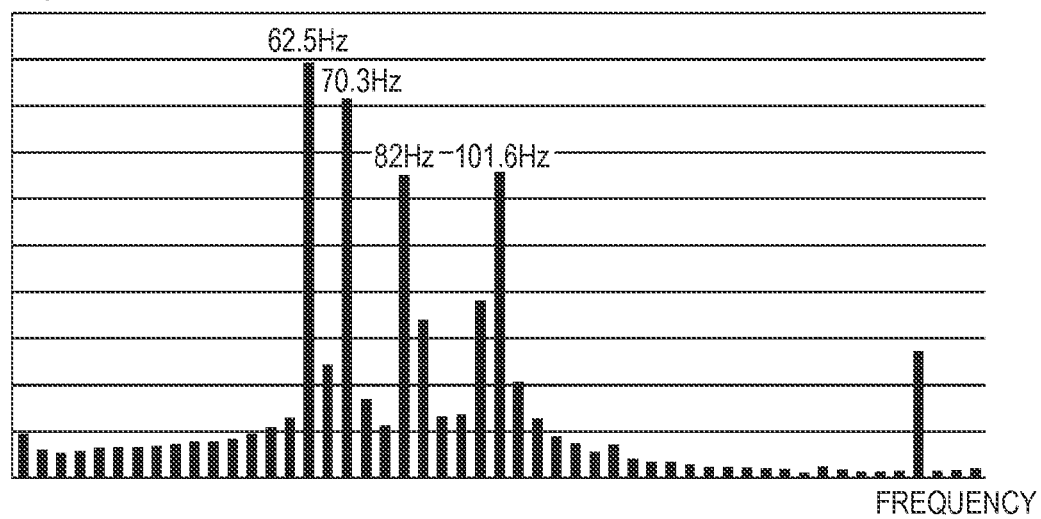

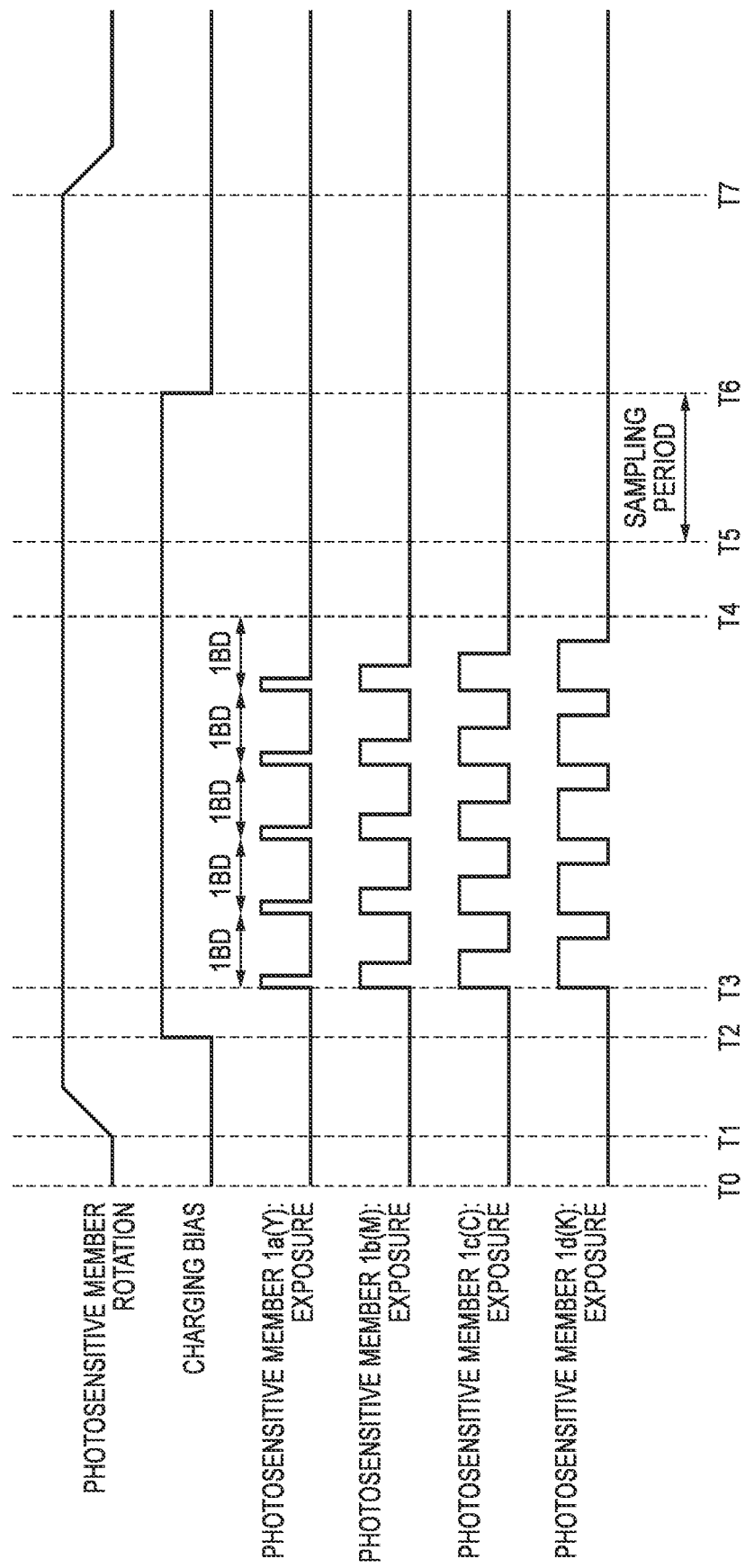

▨ : ELECTROSTATIC LATENT IMAGE

Vd : PHOTOSENSITIVE MEMBER POTENTIAL IN NON-EXPOSED REGION
Vl : PHOTOSENSITIVE MEMBER POTENTIAL IN EXPOSED REGION
▨ : ELECTROSTATIC LATENT IMAGE

Rd : VIRTUAL RESISTOR CORRESPONDING TO
     NON-EXPOSED REGION
Rl : VIRTUAL RESISTOR CORRESPONDING TO
     EXPOSED REGION

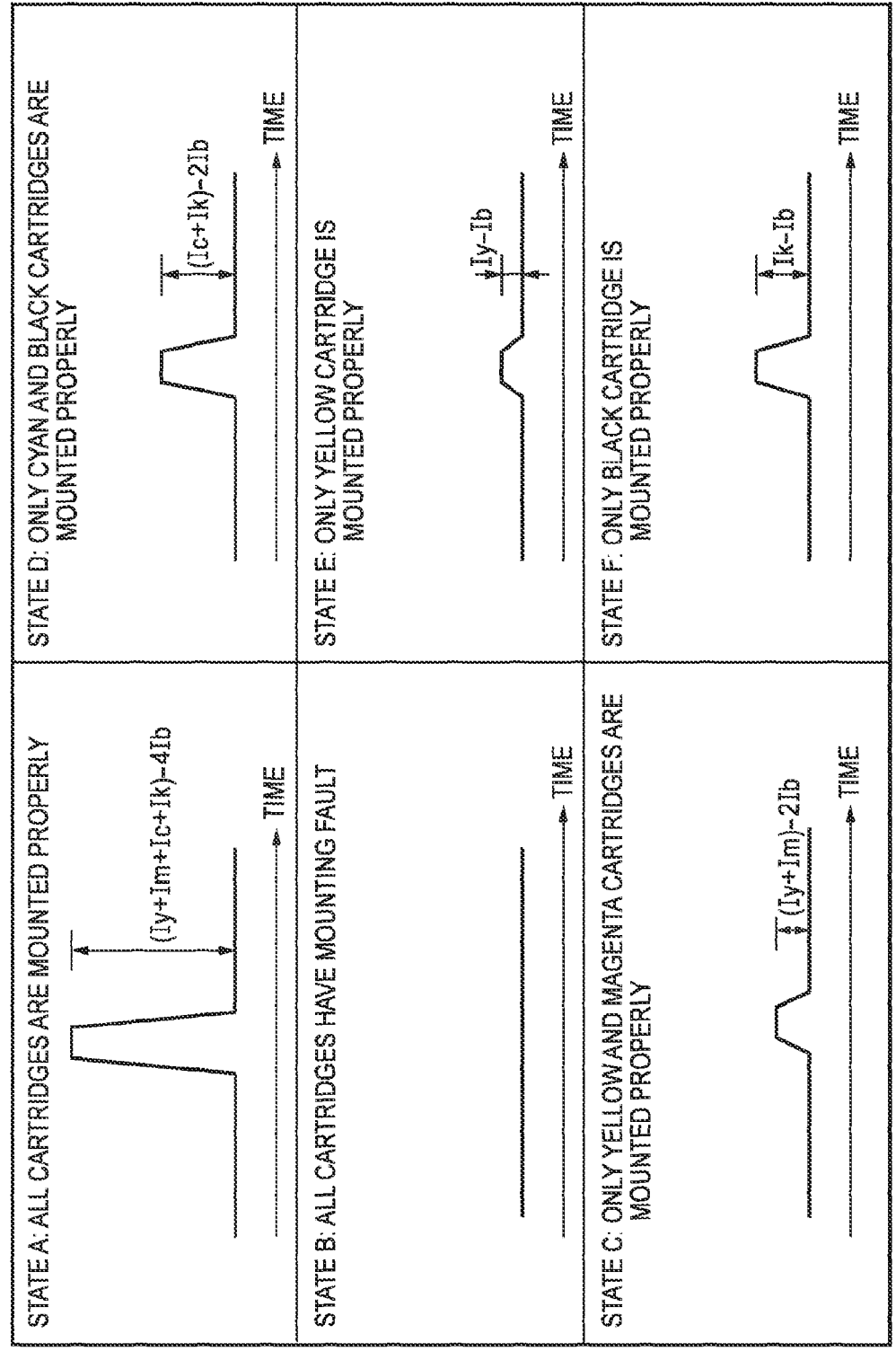

FIG. 20

| LABEL | #1 | #2 | #3 | #4 | #5 | #6 | #7 | #8 | #9 | #10 | #11 | #12 | #13 | #14 | #15 | #16 |
|---|---|---|---|---|---|---|---|---|---|---|---|---|---|---|---|---|
| Iy | 0 | 1 | 0 | 1 | 0 | 1 | 0 | 1 | 0 | 1 | 0 | 1 | 0 | 1 | 0 | 1 |
| Im | 0 | 0 | 2 | 2 | 0 | 0 | 2 | 2 | 0 | 0 | 2 | 2 | 0 | 0 | 2 | 2 |
| Ic | 0 | 0 | 0 | 0 | 4 | 4 | 4 | 4 | 0 | 0 | 0 | 0 | 4 | 4 | 4 | 4 |
| Ik | 0 | 0 | 0 | 0 | 0 | 0 | 0 | 0 | 8 | 8 | 8 | 8 | 8 | 8 | 8 | 8 |
| TOTAL VALUE | 0 | 1 | 2 | 3 | 4 | 5 | 6 | 7 | 8 | 9 | 10 | 11 | 12 | 13 | 14 | 15 |
| PROPERLY MOUNTED NUMBER | 0 | 1 | 1 | 2 | 1 | 2 | 2 | 3 | 1 | 2 | 2 | 3 | 2 | 3 | 3 | 4 |
| TOTAL Ib | 0 | 0.5 | 0.5 | 1 | 0.5 | 1 | 1 | 1.5 | 0.5 | 1 | 1 | 1.5 | 1 | 1.5 | 1.5 | 2 |
| VARIATION | 0 | 0.5 | 1.5 | 2 | 3.5 | 4 | 5 | 5.5 | 7.5 | 8 | 9 | 9.5 | 11 | 11.5 | 12.5 | 13 |

F I G. 25

| LABEL | #1 | #2 | #3 | #4 | #5 | #6 | #7 | #8 | #9 | #10 | #11 | #12 | #13 | #14 | #15 | #16 |
|---|---|---|---|---|---|---|---|---|---|---|---|---|---|---|---|---|
| Iy2 | 0 | 8 | 0 | 8 | 0 | 8 | 0 | 8 | 0 | 8 | 0 | 8 | 0 | 8 | 0 | 8 |
| Im2 | 0 | 0 | 4 | 4 | 0 | 0 | 4 | 4 | 0 | 0 | 4 | 4 | 0 | 0 | 4 | 4 |
| Ic2 | 0 | 0 | 0 | 0 | 2 | 2 | 2 | 2 | 0 | 0 | 0 | 0 | 2 | 2 | 2 | 2 |
| Ik2 | 0 | 0 | 0 | 0 | 0 | 0 | 0 | 0 | 1 | 1 | 1 | 1 | 1 | 1 | 1 | 1 |
| TOTAL VALUE | 0 | 8 | 4 | 12 | 2 | 10 | 6 | 14 | 1 | 9 | 5 | 13 | 3 | 11 | 7 | 15 |
| PROPERLY MOUNTED NUMBER | 0 | 1 | 1 | 2 | 1 | 2 | 2 | 3 | 1 | 2 | 2 | 3 | 2 | 3 | 3 | 4 |
| TOTAL Ib | 0 | 0.5 | 0.5 | 1 | 0.5 | 1 | 1 | 1.5 | 0.5 | 1 | 1 | 1.5 | 1 | 1.5 | 1.5 | 2 |
| VARIATION | 0 | 7.5 | 3.5 | 11 | 1.5 | 9 | 5 | 12.5 | 0.5 | 8 | 4 | 11.5 | 2 | 9.5 | 5.5 | 13 |

FIG. 26

| LABEL | | #1 | #2 | #3 | #4 | #5 | #6 | #7 | #8 | #9 | #10 | #11 | #12 | #13 | #14 | #15 | #16 |
|---|---|---|---|---|---|---|---|---|---|---|---|---|---|---|---|---|---|
| Iy | | 0 | 1 | 0 | 1 | 0 | 1 | 0 | 1 | 0 | 1 | 0 | 1 | 0 | 1 | 0 | 1 |
| Im | | 0 | 0 | 2 | 2 | 0 | 0 | 2 | 2 | 0 | 0 | 2 | 2 | 0 | 0 | 2 | 2 |
| Ic | | 0 | 0 | 0 | 0 | 4 | 4 | 4 | 4 | 0 | 0 | 0 | 0 | 4 | 4 | 4 | 4 |
| Ik | | 0 | 0 | 0 | 0 | 0 | 0 | 0 | 0 | 8 | 8 | 8 | 8 | 8 | 8 | 8 | 8 |
| TOTAL VALUE | | 0 | 1 | 2 | 3 | 4 | 5 | 6 | 7 | 8 | 9 | 10 | 11 | 12 | 13 | 14 | 15 |
| PROPERLY MOUNTED NUMBER | | 0 | 1 | 1 | 2 | 1 | 2 | 2 | 3 | 1 | 2 | 2 | 3 | 2 | 3 | 3 | 4 |
| TOTAL Ib | | 0 | 0.5 | 0.5 | 1 | 0.5 | 1 | 1 | 1.5 | 0.5 | 1 | 1 | 1.5 | 1 | 1.5 | 1.5 | 2 |
| VARIATION | | – | 0.5 | 1.5 | 1.9 | 3.2 | 3.9 | 4.8 | 5.5 | 7.1 | 7.9 | 8.8 | 9.5 | 10.7 | 11.4 | 12.3 | 12.9 |
| RANGE | LOWER LIMIT | 0 | 0.4 | 1.3 | 1.9 | 3.2 | 3.9 | 4.8 | 5.4 | 7.1 | 7.9 | 8.8 | 9.4 | 10.7 | 11.4 | 12.3 | 12.9 |
| | UPPER LIMIT | 0.1 | 0.7 | 1.6 | 2.3 | 3.6 | 4.2 | 5.1 | 5.9 | 7.6 | 8.2 | 9.1 | 9.8 | 11.1 | 11.7 | 12.6 | – |

▨ : ELECTROSTATIC LATENT IMAGE

| LABEL | | #1 | #2 | #3 | #4 |
|---|---|---|---|---|---|
| Iy | | 0 | 4 | 0 | 4 |
| Im | | 0 | 0 | 8 | 8 |
| TOTAL VALUE | | 0 | 4 | 8 | 12 |
| PROPERLY MOUNTED NUMBER | | 0 | 1 | 1 | 2 |
| TOTAL Ib | | 0 | 0.5 | 0.5 | 1 |
| VARIATION | | 0 | 3.5 | 7.5 | 11 |
| RANGE | LOWER LIMIT | – | 2.8 | 6.7 | 10.3 |
| | UPPER LIMIT | 0.7 | 4.3 | 8.2 | – |

IMAGE FORMING APPARATUS HAVING DETACHABLY MOUNTABLE IMAGE FORMING UNIT

BACKGROUND OF THE INVENTION

1. Field of the Invention

The present invention relates to technology in an image forming apparatus, such as a printer or a copier, for determining the mounted state of an image forming unit that can be removed from the image forming apparatus.

2. Description of the Related Art

In image forming apparatuses, normal printing cannot be performed if the cartridge (the image forming unit) that is to perform image formation is not mounted properly. The image forming apparatus therefore carries out a cartridge mounted state determination. If this determination is carried out using mechanical parts such as switches and actuators, the number of parts increases, and the size of the image forming apparatus increases due to the need to ensure space for such parts. For this reason, Japanese Patent Publication No. 7-60288 discloses a configuration in which the cartridge mounted state determination is carried out using transfer current flowing in a transfer roller due to the transfer roller outputting a transfer bias to a photosensitive member of a cartridge. Also, Japanese Patent Laid-Open No. 6-3891 discloses a configuration in which the cartridge mounted state determination is carried out using charging current flowing in the charging roller due to the charging roller outputting a charging bias to a photosensitive member.

Recent years have seen progress in the reduction of the cost of image forming apparatuses, and a configuration has been used in which the power supply unit that supplies a voltage to an output member that outputs a bias to a photosensitive member of a cartridge is used in common by each cartridge. In an image forming apparatus in which the power supply unit is used in common by multiple cartridges, when a voltage is applied by the power supply unit, current will flow to each of the cartridges. It is therefore possible to specify the number of cartridges that are not mounted based on the current value, but it is not possible to specify which cartridges are not mounted. Also, with a configuration in which the mounted state is determined by the power supply unit applying a voltage to only specific cartridges in order, a circuit is needed in order to switch the voltage application, and the determination becomes time-consuming due to the time needed to switch the voltage application destination and the like.

SUMMARY OF THE INVENTION

According to an aspect of the present invention, an image forming apparatus includes: a plurality of image forming units that are each configured to be detachably mountable and include an image carrier that is driven to rotate; a light irradiation unit configured to irradiate respective image carriers of the plurality of image forming units with light to form one or more electrostatic latent images along a direction of the rotational driving; a detection unit configured to detect the one or more electrostatic latent images; a determination unit configured to determine mounted states of the plurality of image forming units based on a detection result obtained by the detection unit; and a control unit configured to perform control such that, for each of image carriers, the one or more electrostatic latent images are not formed on an image carrier in a period in which at least one of the one or more electrostatic latent images is formed on a different image carrier.

Further features of the present invention will become apparent from the following description of exemplary embodiments with reference to the attached drawings.

BRIEF DESCRIPTION OF THE DRAWINGS

FIG. 12 is a diagram showing charging current according to an embodiment.

FIG. 13 is a diagram showing results of charging current frequency analysis according to an embodiment.

FIG. 16 is a timing chart for mounting determination processing according to an embodiment.

FIG. 19 is a diagram illustrating change in charging current when electrostatic latent images pass a position opposing a charging roller according to an embodiment.

FIG. 20 is a diagram showing a relationship between cartridge mounted states and charging current according to an embodiment.

FIG. 25 is a diagram showing a relationship between cartridge mounted states and charging current according to an embodiment.

FIG. 26 is a diagram showing a relationship between cartridge mounted states and charging current according to an embodiment.

DESCRIPTION OF THE EMBODIMENTS

Figure 1:
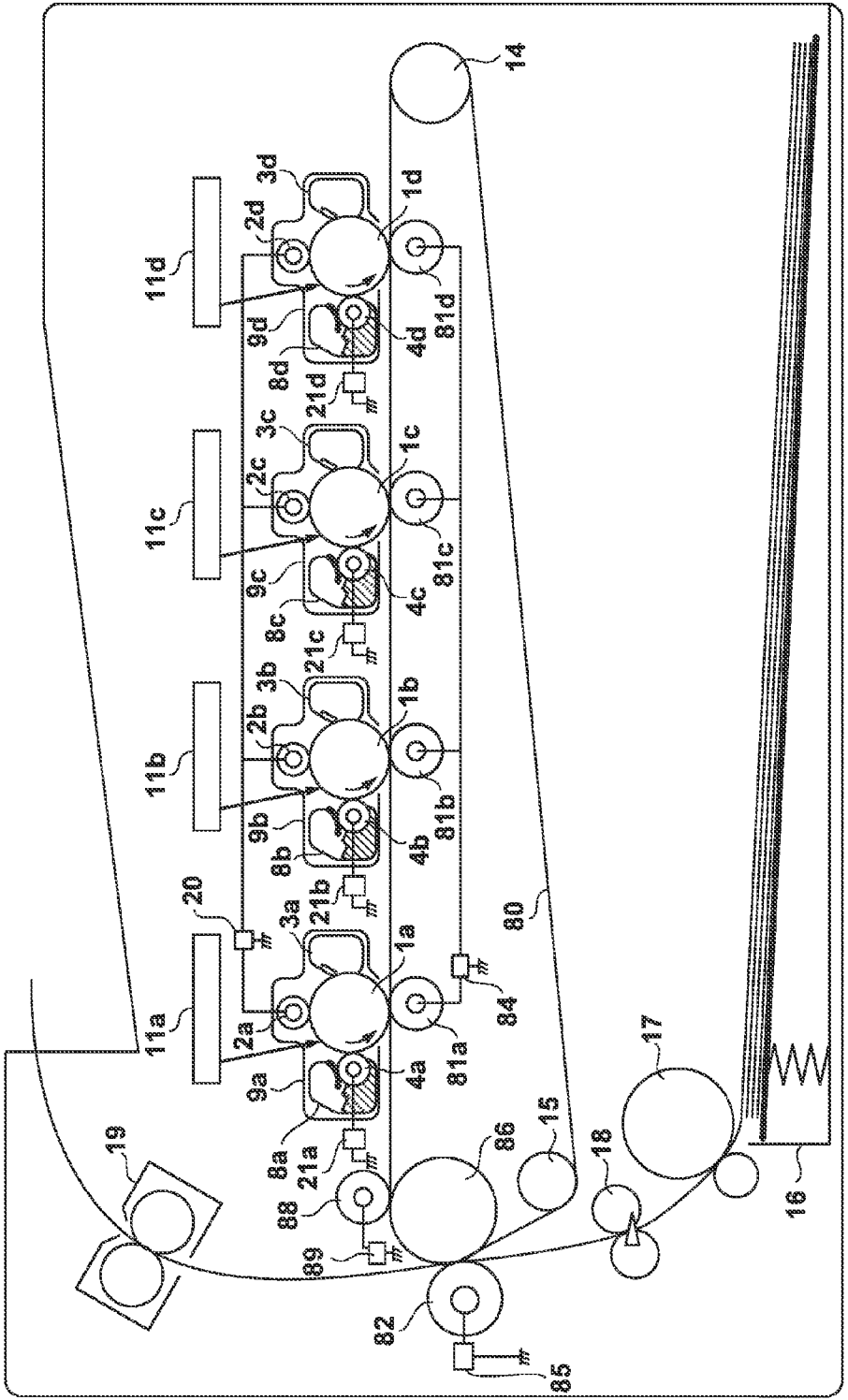
FIG. 1 is a diagram showing a configuration of an image forming apparatus according to an embodiment.

Illustrative embodiments of the present invention will be described below with reference to the drawings. Note that the following embodiments are illustrative, and the scope of the present invention is not intended to be limited to the content of the embodiments. Also, constituent elements not essential to the description of the embodiments are not shown in the drawings referenced below.

First Embodiment

FIG. 1 is a diagram showing the configuration of an image forming apparatus according to the present embodiment. Note that the letters a, b, c, and d appended to the reference numbers in FIG. 1 respectively indicate that the corresponding members form yellow (Y), cyan (C), magenta (M), and black (K) developer images on an intermediate transfer belt 80. Reference numbers not appended with letters will be used in the following description when there is no need to distinguish between the colors of the formed developer image. A photosensitive member 1 is an image carrier that is driven to rotate in the direction indicated by the arrow in the figure. A charging roller 2 charges the surface of the photosensitive member 1 to a predetermined potential by applying a charging bias. An exposure unit 11 is a light irradiation unit that forms an electrostatic latent image on the surface of the corresponding photosensitive member 1 by scanning and exposing the photosensitive member 1 by irradiating it with light that corresponds to the image to be formed on the photosensitive member 1. A developing unit 8 has a developer and a developing roller 4, and visualizes the electrostatic latent image on the photosensitive member 1 into a developer image by supplying the developer to the electrostatic latent image using a developing bias applied by the developing roller 4. A primary transfer roller 81 transfers the developer image on the photosensitive member 1 to the intermediate transfer belt 80 by applying a primary transfer bias. Note that a multi-color toner image can be formed if developer images formed on multiple photosensitive members 1 are transferred to the intermediate transfer belt 80 in an overlapped manner. A cleaning unit 3 removes developer remaining on the photosensitive member 1 that has not been transferred from the photosensitive member 1 to the intermediate transfer belt 80. In the present embodiment, the photosensitive member 1, the charging roller 2, the developing unit 8, and the cleaning unit 3 configure a cartridge 9 (image forming unit) that can be removed from the image forming apparatus. Note that the members included in the cartridge 9 are not limited to the above-described members, and it may include the primary transfer roller 81 and the exposure unit 11, or may be configured without any of the above-described members, excluding the photosensitive member 1.

In the present embodiment, a charging bias power supply 20 supplies voltages to the charging rollers 2a, 2b, 2c, and 2d (output members) in order for the charging rollers 2a, 2b, 2c, and 2d to output the charging bias. The charging bias power supply 20 outputs a current that is the total of the charging currents that are to flow in the charging rollers 2, and thus the charging bias power supply 20 has a measurement circuit for measuring the total current value. Similarly, a primary transfer bias power supply 84 supplies voltages to the primary transfer rollers 81a, 81b, 81c, and 81d (output members) in order for the primary transfer rollers 81a, 81b, 81c, and 81d to output the primary transfer bias. Similarly to the charging bias power supply 20, the primary transfer bias power supply 84 has a measurement circuit for measuring the total value of the transfer currents that are to flow in the primary transfer rollers 81. Note that in the present embodiment, the developing rollers 4a, 4b, 4c, and 4d are respectively provided with individual developing bias power supplies 21a, 21b, 21c, and 21d. However, there is no limitation to this, and a configuration is possible in which a developing bias power supply 21 is used in common for multiple colors.

The intermediate transfer belt 80 is supported by three rollers 14, 15, and 86, and is driven to rotate along with rotation of the roller 14. A recording material in a cassette 16 is fed to a conveying path by a pickup roller 17 and conveyed by rollers 18 to a nip portion between a secondary transfer roller 82 and the intermediate transfer belt 80. The secondary transfer roller 82 transfers the developer image on the intermediate transfer belt 80 to the recording material by applying a secondary transfer bias. Note that the secondary transfer bias is supplied from a secondary transfer bias power supply 85. The recording material with the transferred developer image thereon is then conveyed to a fixing unit 19. The fixing unit 19 fixes the developer image to the recording material by applying heat and pressure to the recording material. The recording material with the fixed developer image thereon is then discharged to the outside of the apparatus.

Figure 2:
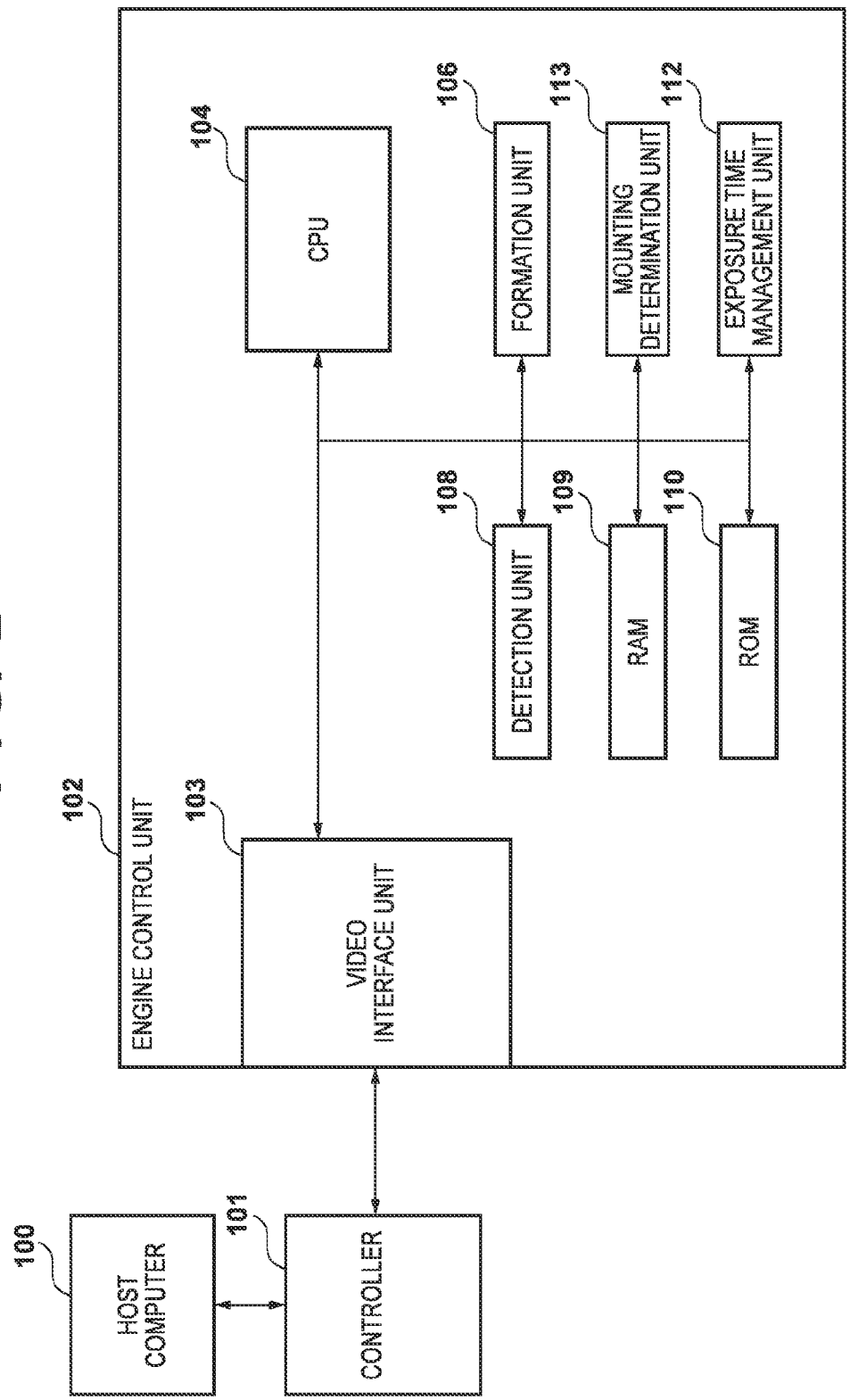
FIG. 2 is a diagram showing a control configuration of the image forming apparatus according to an embodiment.

FIG. 2 is a diagram showing the control configuration of the image forming apparatus according to the present embodiment. In FIG. 2, a host computer 100 is an information source that outputs a printing target image to the image forming apparatus and causes printing to be performed. A controller 101 of the image forming apparatus converts image data received from the host computer 100 in accordance with predetermined processes, and outputs the converted image data to an engine control unit 102 via a video interface unit 103.

The engine control unit 102 has a CPU 104 and performs overall control regarding image formation by executing a program stored in a ROM 110. Note that the ROM 110 also stores data used when the engine control unit 102 performs control. A RAM 109 is used as a work area for the storage of temporary data when the CPU 104 performs control, for example. A formation unit 106 forms an electrostatic latent image in later-described mounting determination processing, and a detection unit 108 detects a charging current value or a transfer current value, which are the values of the output of the charging bias power supply 20 or the primary transfer bias power supply 84 in mounting determination processing. A mounting determination unit 113 determines the mounted states of the cartridges 9 based on detection results from the detection unit 108. Also, an exposure time management unit 112 manages the exposure times of the photosensitive members 1. Note that the formation unit 106, the detection unit 108, the mounting determination unit 113, and the exposure time management unit 112 can be realized by software as programs executed by the CPU 104, realized as individual pieces of hardware, or realized as a combination of software and hardware.

Figure 3:
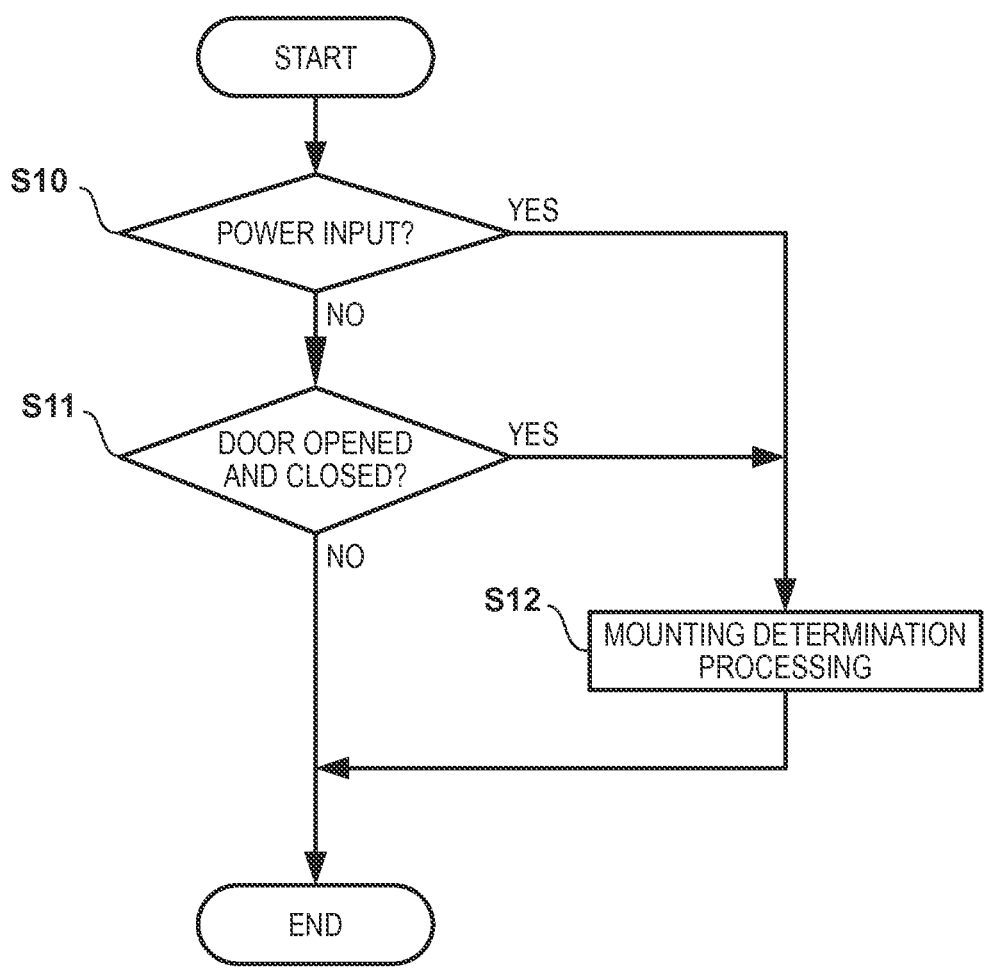
FIG. 3 is a flowchart showing processing performed by the image forming apparatus according to an embodiment.

FIG. 3 is a flowchart of processing executed by the engine control unit 102 according to the present embodiment. The engine control unit 102 determines whether power has immediately previously been supplied to the image forming apparatus in step S10, and performs mounting determination processing in step S12 if power has immediately previously been supplied. On the other hand, if power has not immediately previously been supplied, the engine control unit 102 determines in step S11 whether the door for replacing the cartridges 9 was opened and closed, and performs mounting determination processing in step S12 if the door was opened and closed. Note that processing in FIG. 3 is performed repeatedly. FIG. 3 shows an example, and the mounting determination processing can be executed if a certain determination condition is satisfied.

Figure 4:
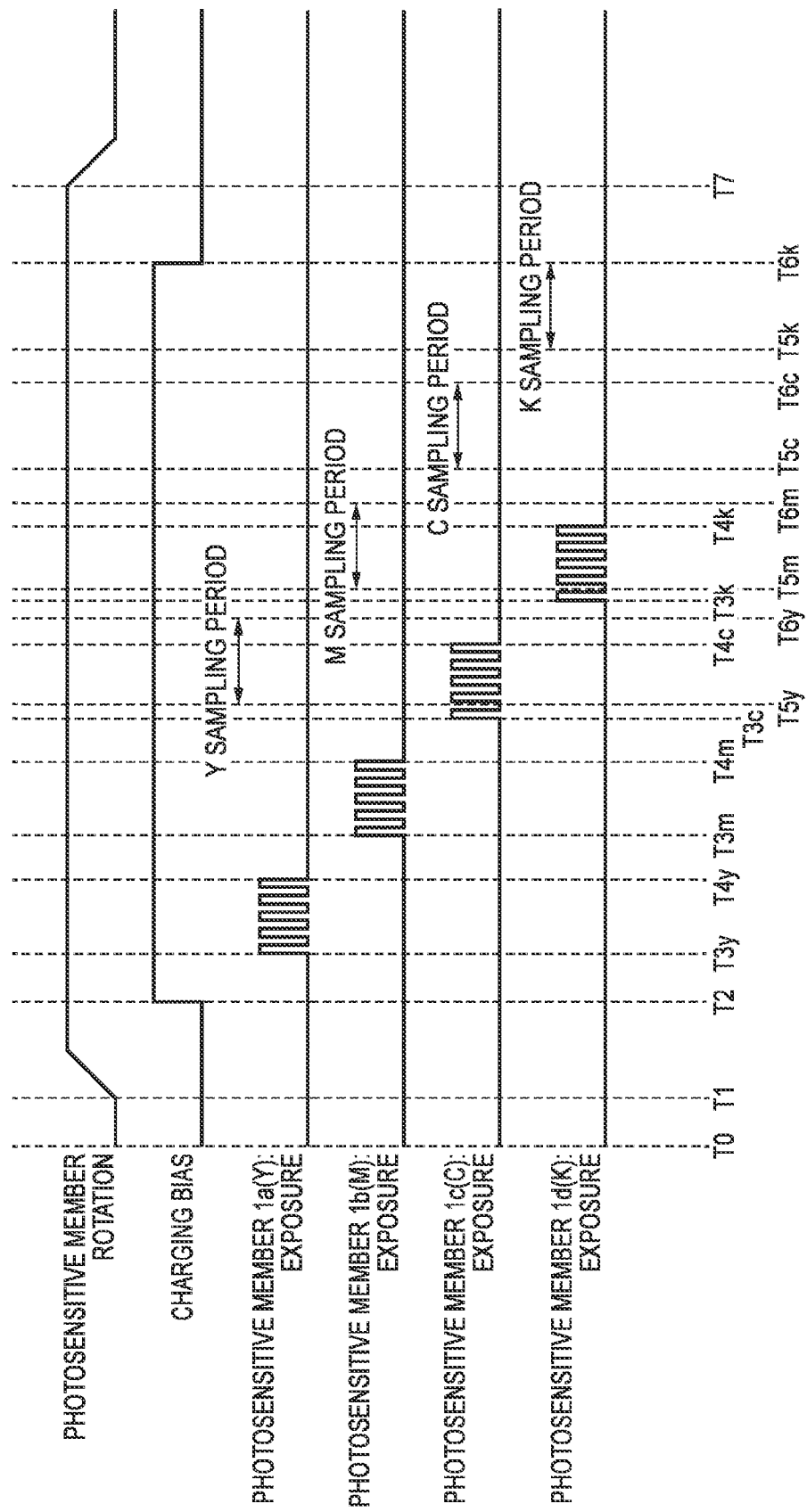
FIG. 4 is a timing chart for mounting determination processing according to an embodiment.
Figure 5:
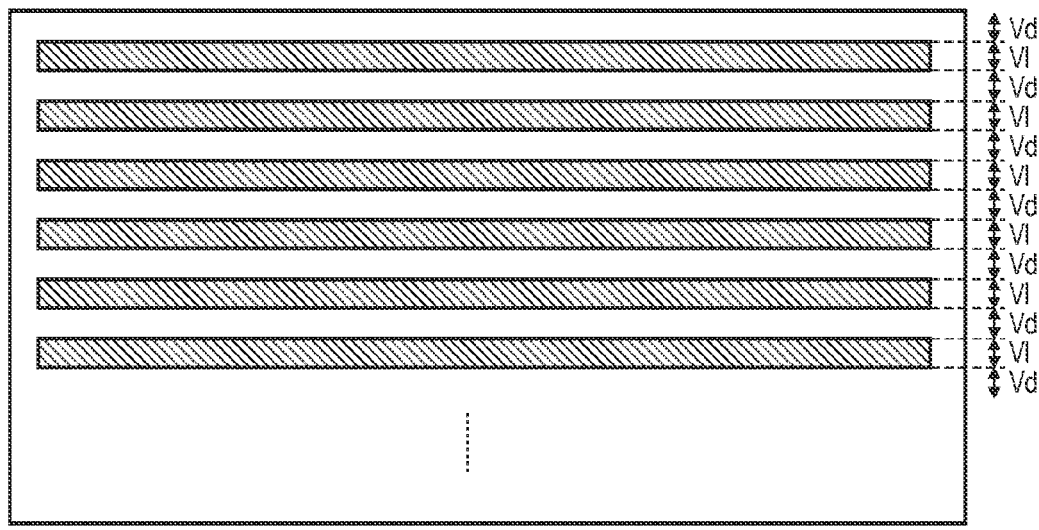
FIG. 5 is a diagram showing electrostatic latent images formed in the mounting determination processing according to an embodiment.

FIG. 4 is a timing chart for mounting determination processing according to the present embodiment. The engine control unit 102 starts the mounting determination processing at a time T0, and then rotates the photosensitive members 1 at a time T1. After the rotation of the photosensitive members 1 has stabilized, the engine control unit 102 outputs the charging bias to the photosensitive members 1 at a time T2. When the charged portion of the photosensitive member 1a reaches the exposure position at a time T3y, the formation unit 106 of the engine control unit 102 forms an electrostatic latent image by exposing the surface of the photosensitive member 1a until a time T4y. Thereafter, the formation unit 106 forms an electrostatic latent image on the photosensitive member 1b from a time T3m to a time T4m, on the photosensitive member 1c from a time T3c to a time T4c, and on the photosensitive member 1d from a time T3k to a time T4k. In the present embodiment, the periods for forming electrostatic latent images on the photosensitive members 1 are set so as to not overlap each other as shown in FIG. 4. Also, electrostatic latent images are repeatedly formed on the photosensitive members 1 along the rotation direction, that is to say the sub scanning direction, of the photosensitive members 1 as shown in FIG. 5. Note that although the length of each electrostatic latent image in the main scanning direction is equal to the overall length of the image formation region on the photosensitive member 1 in FIG. 5, it may be shorter than the image formation region. The detection unit 108 of the engine control unit 102 starts sampling the charging current before each of the electrostatic latent images formed on the photosensitive members 1 reaches a position opposing the charging roller 2. In FIG. 4, sampling is performed from a time T5y to a time T6y, from a time T5m to a time T6m, from a time T5c to a time T6c, and from a time T5k to a time T6k. When the sampling ends at the time T6k, the engine control unit 102 stops the output of the charging bias, and then stops the rotation of the photosensitive members 1 at a time T7. Based on the sampling values, the mounting determination unit 113 determines a cartridge 9 that is not mounted or has a mounted state that is faulty (referred to hereinafter as a mounting fault).

The following describes how the mounting determination unit 113 specifies whether a mounting fault has occurred and specifies the cartridge 9 with which the mounting fault occurred. In the present embodiment, electrostatic latent images are formed on the photosensitive members 1 as shown in FIG. 5. Note that the electrostatic latent image is repeatedly formed in order to reduce the possibility of erroneous detection due to noise or the like, and a configuration is possible in which only one line-shaped electrostatic latent image is formed on each of the photosensitive members 1. As shown in FIG. 5, the potential of the region of the photosensitive member 1 where the electrostatic latent image is not formed remains at the charging potential Vd, and the potential of the region where the electrostatic latent image is formed is V1, which is different from Vd. Accordingly, when the electrostatic latent image reaches the position opposing the charging roller 2, the potential difference between the potential of the surface of the photosensitive member 1 and the potential of the charging roller 2 changes, and the charging current flowing in the photosensitive member 1 also changes. Specifically, the charging current temporarily increases as the electrostatic latent image passes the position opposing the charging roller 2, and then the charging current returns to its previous current value.

In the present embodiment, the timing for forming the electrostatic latent image is different for each of the photosensitive members 1, and therefore the timing at which the formed electrostatic latent image passes the position opposing the charging roller 2 is different for each of the photosensitive members 1. Accordingly, the mounting determination unit 113 can specify that a change in the charging current sampled from the time T5y to the time T6y is due to the electrostatic latent image formed on the photosensitive member 1a. Similarly, the mounting determination unit 113 can specify that changes in the charging current sampled from the time T5m to the time T6m, from the time T5c to the time T6c, and from the time T5k to the time T6k are respectively due to the electrostatic latent images formed on the photosensitive members 1b, 1c, and 1d. Note that if a cartridge 9 has a mounting fault, the electrostatic latent image is not formed, and there is no change in the charging current. Accordingly, if the same number of changes in the charging current as the number of electrostatic latent images formed on a photosensitive member 1 is detected in the sampling period for detecting change in the charging current for that photosensitive member 1, the mounting determination unit 113 can determine that the mounted state of the cartridge 9 corresponding to that photosensitive member 1 is normal. Note that it can also be determined that the cartridge 9 is normally mounted if the number of detected changes in the current is within a range giving a margin to the number of formed electrostatic latent images. On the other hand, if a change in the charging current is not detected, or the number of detected changes is outside the range giving a margin to the number of formed electrostatic images in the sampling period for detecting change in the charging current for a photosensitive member 1, it can be determined that the cartridge 9 corresponding to that photosensitive member 1 has a mounting fault. Note that the number of changes is incremented by one each time the charging current rises above a predetermined threshold value and then falls below the predetermined threshold value, for example. Also, the number of changes can be the number of times that the charging current rises from a value below the predetermined threshold value to a value greater than or equal to the predetermined threshold value, or the number of times the charging current falls from a value greater than or equal to the predetermined threshold value to a value below the predetermined threshold value.

As described above, by forming electrostatic latent images on the photosensitive members 1 of the cartridges 9 at different timings and then detecting changes in the charging current and the timings thereof, it is possible to specify a cartridge 9 that has a mounting fault. In the present embodiment, there is no need to switch the charging roller 2 that receives a voltage from the charging bias power supply 20, and the mounted states of the cartridges 9 can be determined in a short period of time. Note that although line-shaped electrostatic latent images extending in the main scanning direction are formed in FIG. 5, it need only be possible to detect a change in the charging current, and the direction of the formed line need only be different from the sub scanning direction. Also, the line does not need to be continuous, and may be a dashed line, a dotted line, or an interrupted line.

Also, in FIG. 4, the periods for forming the electrostatic latent images on the photosensitive members 1 do not overlap each other, thus making it possible to independently detect the electrostatic latent images formed on the respective photosensitive members 1, but the present invention is not limited to this mode. For example, a configuration is possible in which periods partially overlap each other such that the electrostatic latent images formed on one photosensitive member 1 do not pass the position opposing the charging roller 2 while at least one of the electrostatic latent images formed on another photosensitive member 1 is passing the position opposing the charging roller 2. Note that the cartridges 9 have the same configuration with the exception of the color of developer used. Accordingly, at least one of the electrostatic latent images formed on each of the photosensitive members 1 can be detected independently if the electrostatic latent images are not formed on one photosensitive member 1 while at least one of the electrostatic latent images is formed on another photosensitive member 1.

Also, although the determination is carried out based on the charging current in the present embodiment, it is also possible to use the transfer current flowing when the developer is transferred to the intermediate transfer belt 80, which is the transfer receiver, for similar reasons. This is because the potential difference between the potential of the primary transfer roller 81 and the potential of the surface of the photosensitive members 1 changes depending on whether the electrostatic latent image is present, and therefore the transfer current also changes. Note that in the case of using the transfer current, the primary transfer bias is also output from the time T2 to the time T6$k$ in the timing chart in FIG. 4. Also, it goes without saying that the period in which transfer current sampling is performed is the period during which the electrostatic latent image passes the position opposing the primary transfer roller 81. Furthermore, it goes without saying that a transfer current measurement circuit is not necessary in the case of using the charging current, and a charging current measurement circuit is not necessary in the case of using the transfer current. Also, besides the charging current and the transfer current, the developing bias is output by the developing roller, and therefore the cartridge mounted state may be determined based on the developing current flowing in the developing roller. Also, in the present embodiment, the biases are assumed to be constant, and therefore the cartridge mounted state is determined by measuring the charging current. However, in an image forming apparatus in which the charging current and the like are controlled so as to be constant, the cartridge mounted state can be determined by detecting the electrostatic latent image based on the amount of change in the voltage output by the charging bias power supply 20 or the like.

Note that as described above, the charging current flowing in a photosensitive member 1 changes when the electrostatic latent image formed on that photosensitive member 1 reaches the position opposing the charging roller 2. Accordingly, by detecting this change, it is possible to measure the amount of time from when the electrostatic latent image is formed on the photosensitive member 1 to when that electrostatic latent image reaches the position opposing the charging roller 2. For example, the engine control unit 102 corrects misregistration using the developer image, and then, for each photosensitive member 1, measures the amount of time from when the electrostatic latent image is formed until when the electrostatic latent image reaches the position opposing the charging roller 2, and stores the measured value as a reference value. Then, for each photosensitive member 1, the engine control unit 102 measures the amount of time from when the electrostatic latent image is formed until when the electrostatic latent image reaches the position opposing the charging roller 2, and compares the measured value with the reference value. If the amount of time from when the electrostatic latent image is formed until when the electrostatic latent image reaches the position opposing the charging roller 2 deviates from the reference value, this means that there will also be a deviation in the timing of the transfer of the formed toner image to the intermediate transfer belt 80, which means that misregistration will occur. In this case, the electrostatic latent image formation timing is corrected such that the amount of time from when the electrostatic latent image is formed until when the electrostatic latent image reaches the position opposing the charging roller 2 is the same as the reference value, thus making it possible to correct misregistration without actually forming a developer image.

Accordingly, it is possible to, for example, specify a mounted cartridge by detecting the electrostatic latent image formed on the photosensitive member 1 in the above-described mounting determination processing, and to determine and correct the amount of misregistration based on the electrostatic latent image detection timing. Note that as described above, the electrostatic latent image detection timing can be determined based on the charging current value or the amount of change in the charging current. The same follows for the transfer current and the developing current as well.

Second Embodiment

Next, a second embodiment will be described focusing on differences from the first embodiment. In the first embodiment, one or more line-shaped electrostatic latent images are formed on each photosensitive member 1, and the mounted state of a cartridge 9 is determined based on the number of changes in the charging current. In the present embodiment, multiple line-shaped electrostatic latent images are formed with a predetermined period on each photosensitive member 1, and the mounted state of a cartridge 9 is determined by subjecting the charging current to frequency analysis. The present embodiment will be described below focusing on differences from the first embodiment. Note that in the following description, the electrostatic latent image is repeatedly formed with a predetermined period in the sub scanning direction, and the resulting spatial frequency of the electrostatic latent images in the sub scanning direction will be referred to as the latent image frequency. It should also be noted that the latent image frequency is a value determined by the rotation speed of the photosensitive member 1, the width of the electrostatic latent image in the sub scanning direction, and the interval between electrostatic latent images.

Figure 6:
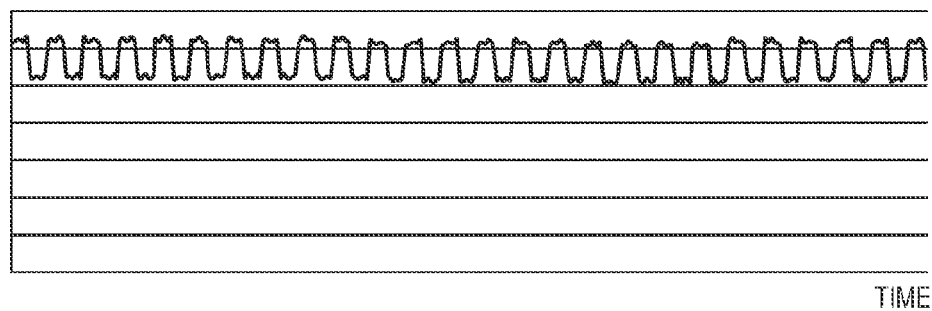
FIG. 6 is a diagram showing charging current according to an embodiment.
Figure 8:
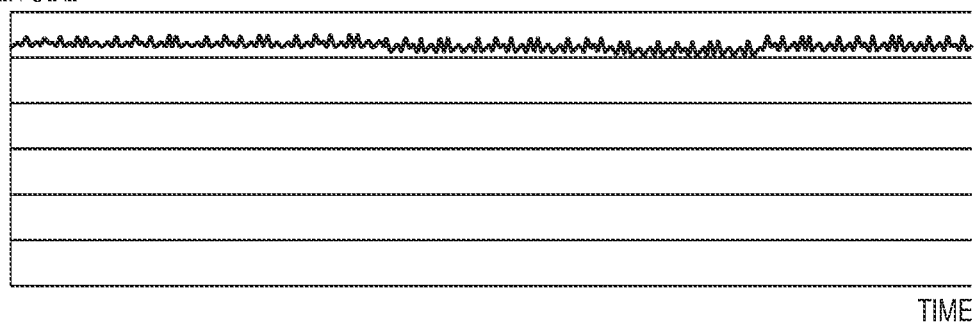
FIG. 8 is a diagram showing charging current according to an embodiment.

The timings in the mounting determination processing of the present embodiment are the same as those in the timing chart of the first embodiment shown in FIG. 4, and the electrostatic latent images shown in FIG. 5 are formed on each photosensitive member 1. FIG. 6 shows change in the charging current caused by the electrostatic latent images formed as shown in FIG. 5. Note that similarly to the first embodiment, if a cartridge 9 has a mounting fault, the charging current will have only a small amount of change due to noise or the like as shown in FIG. 8, and does not have change due to the electrostatic latent image.

Figure 7:
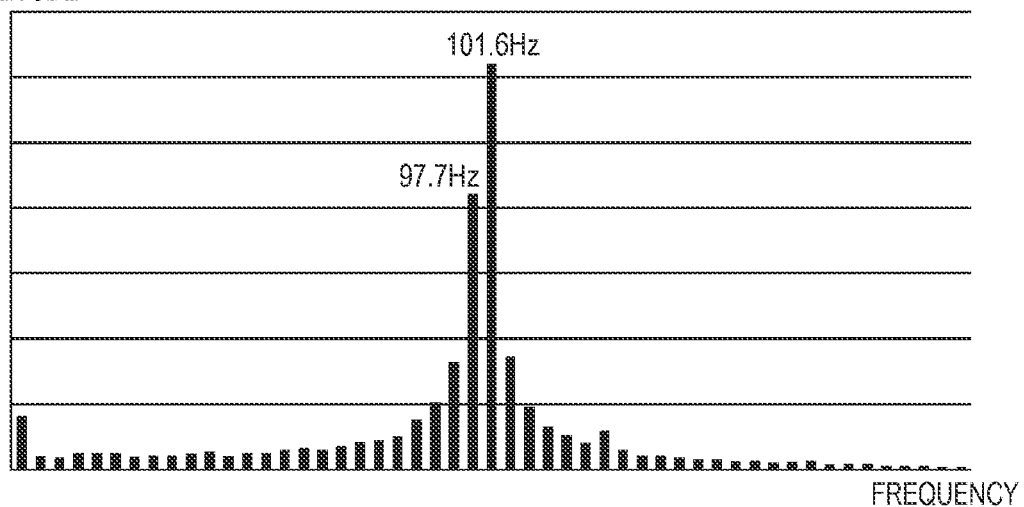
FIG. 7 is a diagram showing results of charging current frequency analysis according to an embodiment.
Figure 9:
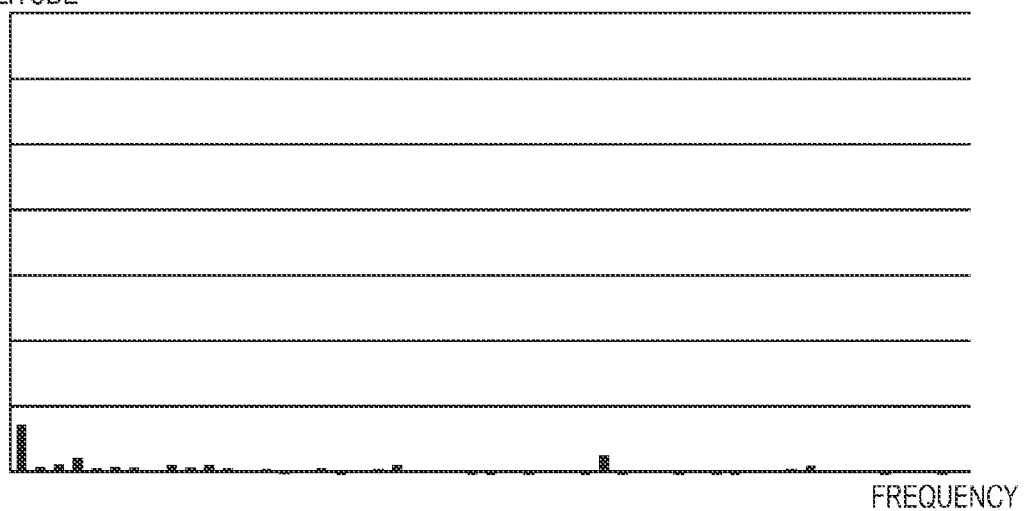
FIG. 9 is a diagram showing results of charging current frequency analysis according to an embodiment.

In the present embodiment, a series of sampling values is obtained for each photosensitive member 1 by performing sampling at the timing when the formed electrostatic latent image passes the position opposing the charging roller 2, and the mounting determination unit 113 subjects each series of sampling value to discrete Fourier transform and then frequency analysis. A Fast Fourier Transform (FFT) algorithm can be used to perform the discrete Fourier transform. FIG. 7 shows the results of Fourier transform performed on the sampling values from the current waveform shown in FIG. 6, and FIG. 9 shows the results of Fourier transform performed on the sampling values from the current waveform shown in FIG. 8. The frequency component obtained by performing discrete Fourier transform has high values at the latent image frequency and in the vicinity thereof as shown in FIG. 7. Accordingly, the mounting determination unit 113 performs frequency analysis on the sampling values acquired at the timing when the electrostatic latent image formed on a photosensitive member 1 passes the position opposing the charging roller 2. If the frequency analysis results indicate that the value of the latent image frequency component is higher than a predetermined value, it can be determined that the cartridge 9 corresponding to that photosensitive member 1 is mounted normally. On the other hand, if the value of the latent image frequency component is lower than or equal to the predetermined value as shown in FIG. 9, it can be determined that the photosensitive member 1 has a mounting fault.

Note that the results shown in FIGS. 7 and 9 are obtained by forming electrostatic latent images at the latent image frequency of 100 Hz, obtaining 256 sampling values with a sampling period of 1 ms, and then performing discrete Fourier transform on the sampling values. The values obtained as a result of discrete Fourier transform make up the discrete frequency component, and if discrete Fourier transform is performed under the above conditions, 97.7 Hz and 101.6 Hz frequency components can be obtained, but a 100 Hz frequency component cannot be obtained. In the present embodiment, the average value is obtained between the frequency component value whose frequency is higher than and the closest to the frequency of the latent image frequency and the frequency component value whose frequency is lower than and the closest to the latent image frequency, and that average value is determined to be the value of the latent image frequency. It goes with saying that if the latent image frequency component can be directly acquired using discrete Fourier transform, that value is used. Note that the frequency component that is the closest to the latent image frequency may be used as the latent image frequency, or the frequency component whose frequency is higher than and the closest to the latent image frequency or the frequency component whose frequency is lower than and the closest to the latent image frequency may be used as the latent image frequency.

As described above, the electrostatic latent image is formed at a predetermined latent image frequency on each photosensitive member 1, and the mounted state of a cartridge 9 can be determined in a short period of time using a latent image frequency component value obtained by subjecting the charging current to frequency analysis. Note that in the present embodiment as well, the determination can be made based on the transfer current or the developing current instead of the charging current.

Also, in the present embodiment as well, the concepts regarding the timings for forming the electrostatic latent image on the photosensitive members 1 are basically the same as those in the first embodiment. Note that in the present embodiment, in order to make the determination based on the latent image frequency component, it is sufficient that the electrostatic latent images formed on one photosensitive member 1 do not pass the position opposing the charging roller 2 while at least two of the electrostatic latent images formed on another photosensitive member 1 are passing the position opposing the charging roller 2.

Note that in the present embodiment, a plurality of electrostatic latent images are formed in order to determine the mounted state of a cartridge 9 based on the latent image frequency component value. However, since the charging current changes even if only one electrostatic latent image is formed, a high frequency component value will be obtained according to the width of the electrostatic latent image in the sub scanning direction and the rotation speed of the photosensitive member 1. On the other hand, if the cartridge 9 has a mounting fault, the charging current has only change due to noise, and the frequency component values are not very high. Accordingly, in the present embodiment as well, similarly to the first embodiment, the mounted state of a cartridge 9 can be determined as long as the electrostatic latent images formed on one photosensitive member 1 do not pass the position opposing the charging roller 2 while at least one of the electrostatic latent images formed on another photosensitive member 1 is passing the position opposing the charging roller 2. In other words, frequency analysis can be applied in the first embodiment as well.

Third Embodiment

Next, a third embodiment will be described focusing on differences from the second embodiment. In the second embodiment, the period for forming electrostatic latent images is set differently for the photosensitive members 1, and, based on the timing of the sampling, it is possible to detect change in the charging current caused by only the electrostatic latent image formed on a certain photosensitive member 1. In the present embodiment, it is possible to form electrostatic latent images on the photosensitive members 1 in the same period. In order to achieve this, the latent image frequency is set differently for the photosensitive members 1. Note that the latent image frequency of the electrostatic latent images formed on the photosensitive members 1 can be determined such that the latent image frequency of the electrostatic latent images formed on one photosensitive member 1 is not a harmonic of the latent image frequency of the electrostatic latent images formed on another photosensitive member 1. According to this configuration, it is possible to suppress erroneous detection caused by a harmonic component. The present embodiment will be described below focusing on differences from the second embodiment.

Figure 10:
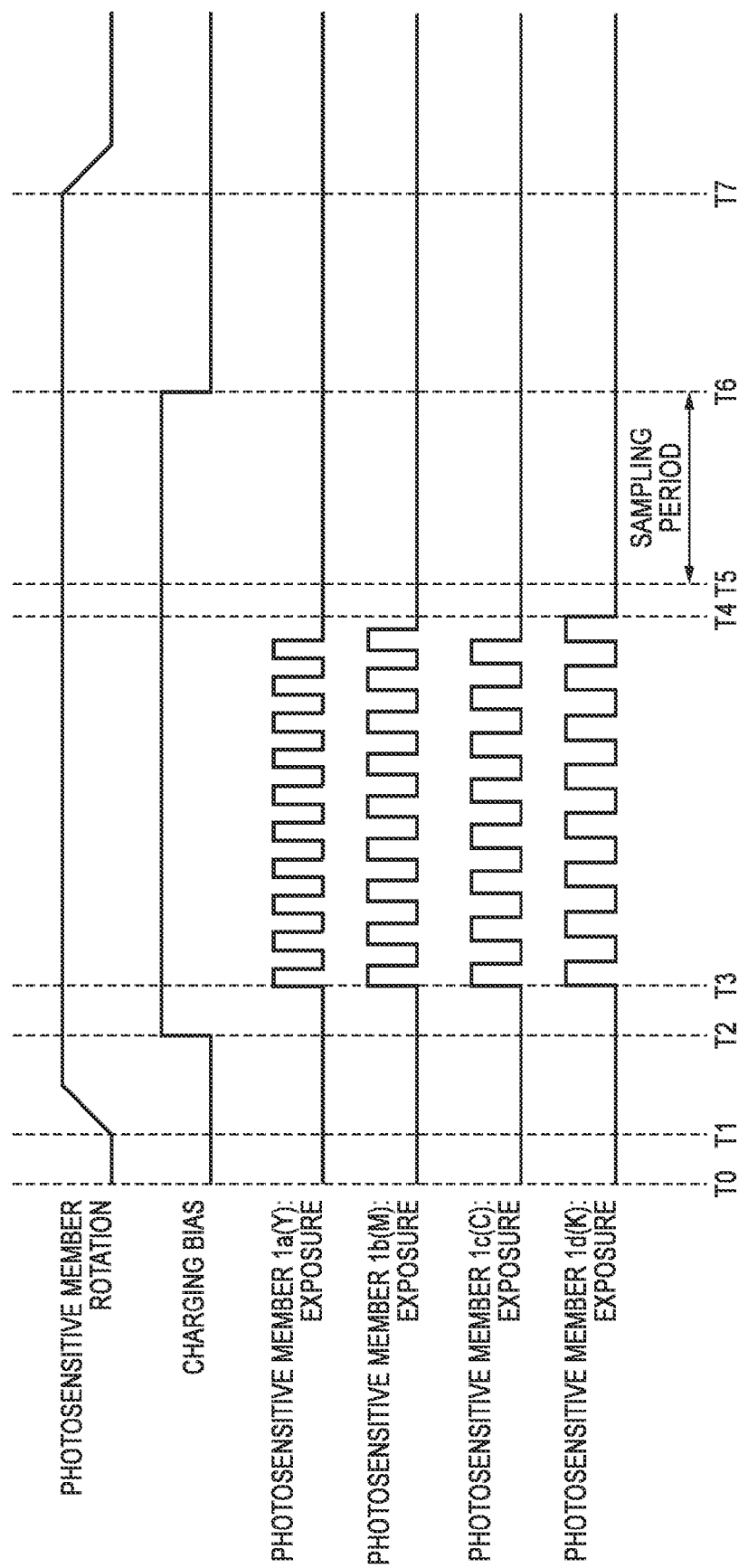
FIG. 10 is a timing chart for mounting determination processing according to an embodiment.
Figure 11:
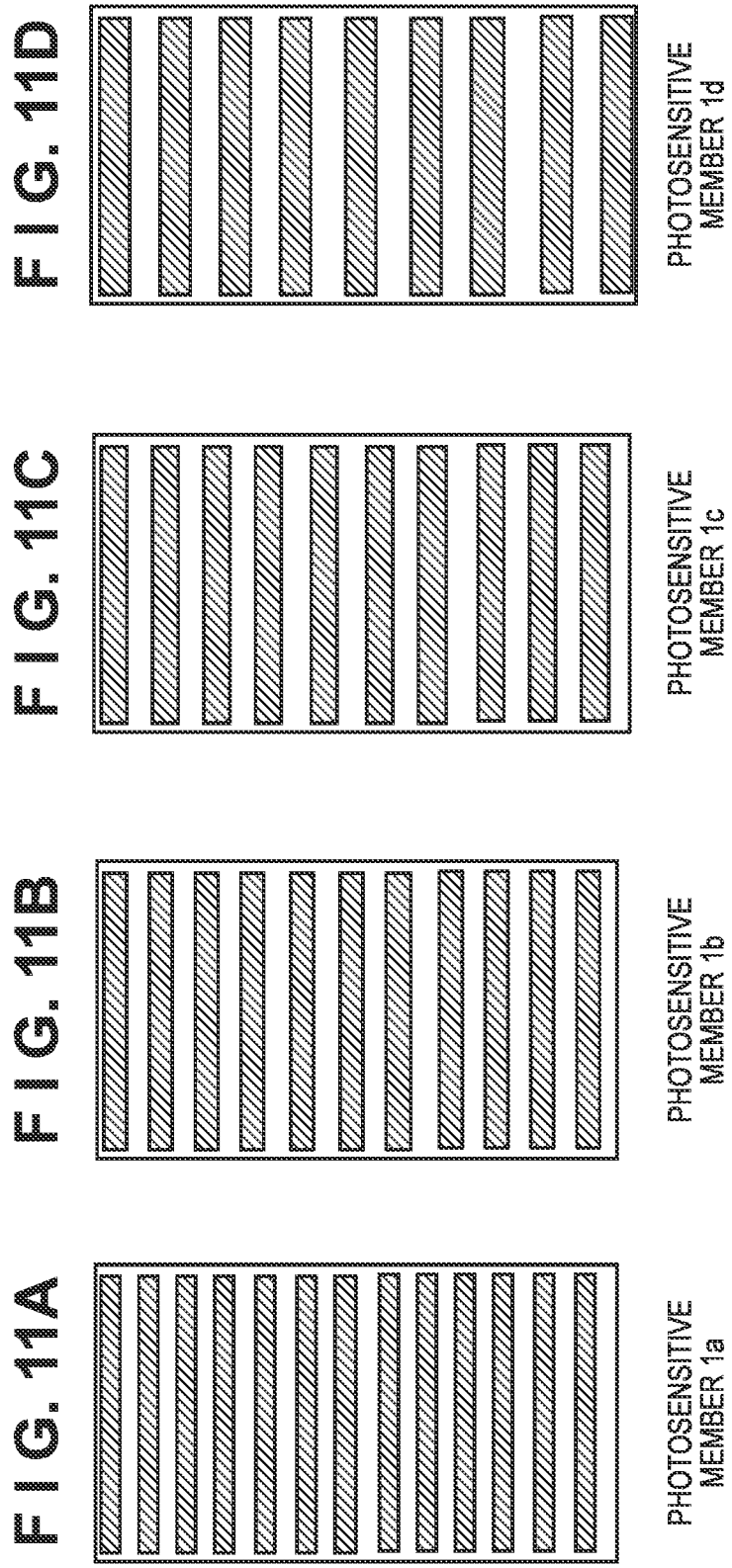
FIGS. 11A to 11D are diagrams showing electrostatic latent images formed in mounting determination processing according to an embodiment.

FIG. 10 is a timing chart for mounting determination processing according to the present embodiment. A difference from the first embodiment shown in FIG. 4 is that, as previously described, electrostatic latent images are formed on all of the photosensitive members 1 from the time T3 to the time T4. Note that the latent image frequency of the formed electrostatic latent images is set differently for the photosensitive members 1. FIGS. 11A to 11D show the electrostatic latent images formed on respective photosensitive members 1 in the present embodiment. Note that the darkened portions in FIGS. 11A to 11D indicate electrostatic latent images. As one example, in FIGS. 11A to 11D, electrostatic latent images are formed on the photosensitive members 1a, 1b, 1c, and 1d with the latent image frequencies of 100 Hz, 83.3 Hz, 71.4 Hz, and 62.5 Hz respectively.

FIG. 12 shows the charging current detected from the time T5 to the time T6 in FIG. 10 after forming electrostatic latent images on the photosensitive members 1 as shown in FIGS.

11A to 11D in the case where all of the cartridges 9 are mounted properly. In the present embodiment, since the electrostatic latent images are formed on the photosensitive members 1 in the same period, the electrostatic latent images formed on the photosensitive members 1 pass the position opposing the charging roller 2 in the same period. Accordingly, the charging current detected by the detection unit 108 is the total of the charging currents in the photosensitive members 1. FIG. 13 shows results of performing frequency analysis on the charging current in FIG. 12. Note that as the sampling conditions, similarly to the second embodiment, 256 sampling values were acquired with a sampling period of 1 ms. The charging current shown in FIG. 12 is the total of the charging current that flowed in each of the photosensitive members 1 and changed according to the latent image frequency. In other words, in this example, this charging current is the superimposition of currents oscillating at 100 Hz, 83.3 Hz, 71.4 Hz, and 62.5 Hz. Accordingly, the currents are superimposed on the time axis, and by performing frequency analysis, it is possible to determine whether or not each of the latent image frequency components is included. Note that similarly to the second embodiment, if it is not possible to directly obtain a frequency component that matches the latent image frequency due to performing discrete Fourier transform, the frequency component is determined based on the frequency component closest to the latent image frequency or the closest frequency components higher and lower than the latent image frequency. In FIG. 13, components higher than the threshold value (not shown) appear at 101.6 Hz, 82 Hz, 70.3 Hz, and 62.5 Hz corresponding to the latent image frequencies of 100 Hz, 83.3 Hz, 71.4 Hz, and 62.5 Hz. Accordingly, it can be determined that all of the cartridges 9 are mounted properly.

Figure 14:
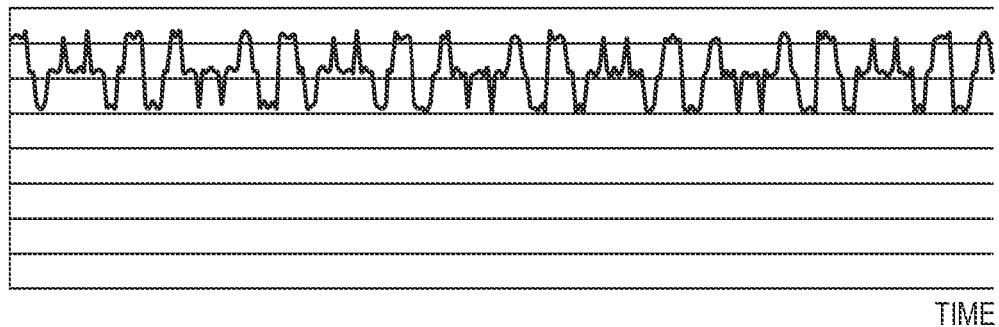
FIG. 14 is a diagram showing charging current according to an embodiment.
Figure 15:
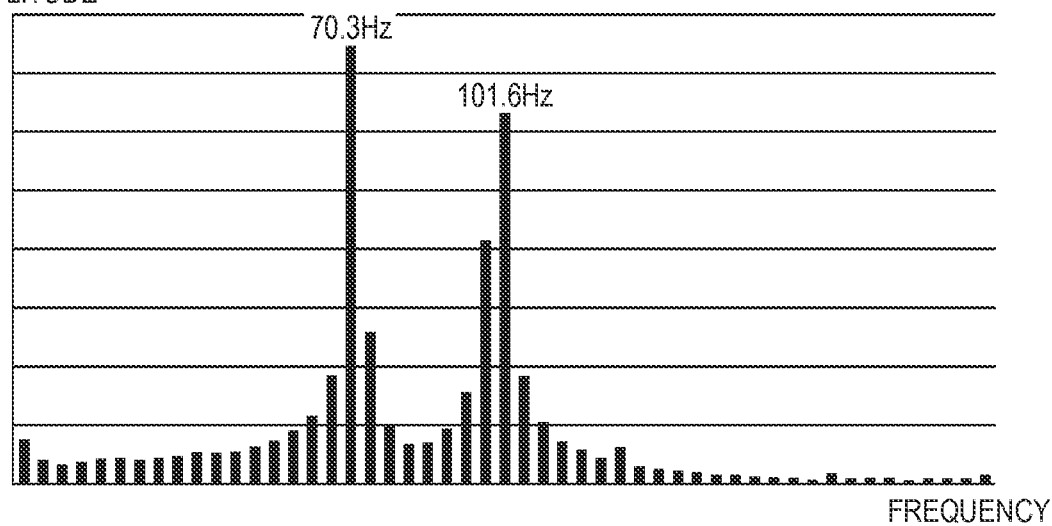
FIG. 15 is a diagram showing results of charging current frequency analysis according to an embodiment.

FIG. 14 shows the charging current detected by the detection unit 108 in the case where the yellow and cyan cartridges 9 are mounted properly, but the magenta and black cartridges 9 have a mounting fault. In other words, in this example, this charging current is the superimposition of currents oscillating at 100 Hz and 71.4 Hz. FIG. 15 shows the results of performing discrete Fourier transform on the charging current shown in FIG. 14. In FIG. 15, components higher than the threshold value (not shown) appear at 101.6 Hz and 70.3 Hz, and therefore it can be determined that the yellow and cyan cartridges 9 are mounted properly, and the magenta and black cartridges 9 have a mounting fault.

As described above, electrostatic latent images having mutually different latent image frequencies are formed on the photosensitive members 1, and the mounted states of the cartridges 9 can be determined using latent image frequency component values obtained by subjecting the charging current to frequency analysis. In the present embodiment, there is no need to shift the timings for forming the electrostatic latent images on the photosensitive members 1, and therefore the mounted states of the cartridges 9 can be determined in a short period of time. Note that in the present embodiment as well, the determination can be made based on the transfer current or the developing current instead of the charging current. Also, in the present embodiment, the electrostatic latent images are formed such that the electrostatic latent images formed on the photosensitive members 1 all pass the position opposing the charging roller 2 in the same period. However, the electrostatic latent images may be formed so as to pass the position opposing the charging roller 2 in mutually different periods similarly to the second embodiment. However, if there is at least partial overlap between the periods in which the electrostatic latent images formed on at least two photosensitive members 1 pass the position opposing the charging roller 2, it is possible to determine the mounted state of the cartridges 9 in a shorter period of time. Furthermore, if there is at least partial overlap between all of the periods in which the electrostatic latent images formed on the photosensitive members 1 pass the position opposing the charging roller 2, it is possible to determine the mounted state of the cartridges 9 in an even shorter period of time.

Fourth Embodiment

Figure 17A:
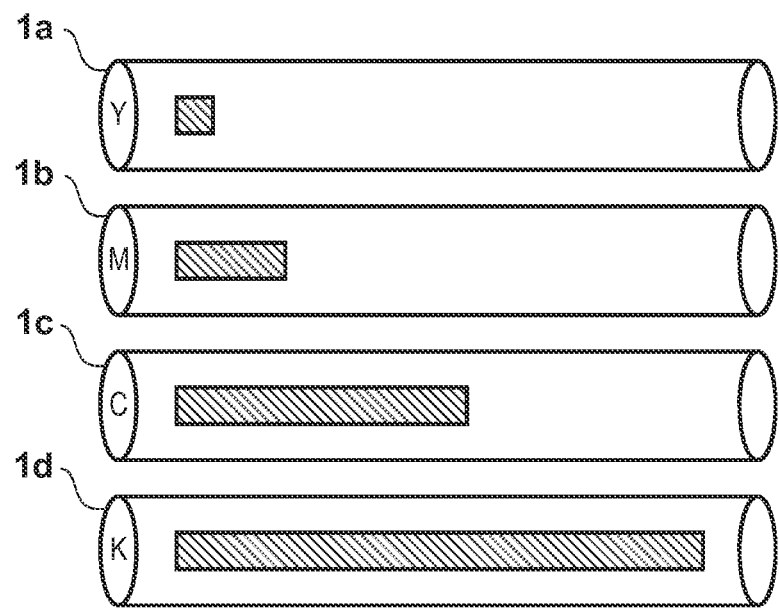
FIGS. 17A and 17B are diagrams respectively showing electrostatic latent images formed in mounting determination processing and a resistance model according to an embodiment.

Next, the present embodiment will be described focusing on differences from the first embodiment. FIG. 16 is a timing chart for mounting determination processing according to the present embodiment. The engine control unit 102 starts the mounting determination processing at a time T0, and then rotates the photosensitive members 1 at a time T1. After the rotation of the photosensitive members 1 has stabilized, the engine control unit 102 outputs the charging bias to the photosensitive members 1 at a time T2. When the charged portions of the photosensitive members 1 reach the exposure position at a time T3, the formation unit 106 of the engine control unit 102 forms electrostatic latent images by exposing the surfaces of the photosensitive members 1. As shown in FIG. 16, the photosensitive members 1 are exposed by switching between an exposed portion that is exposed and a masked portion that is not exposed with the period with which one scan line is scanned (BD period). Note that as shown in FIG. 16, the length of the exposed portion increases in the order of the photosensitive member 1a, the photosensitive member 1b, the photosensitive member 1c, and then the photosensitive member 1d. Accordingly, as shown in FIG. 17A, approximately rectangular electrostatic latent images having different lengths in the main scanning direction are formed on the photosensitive members 1. Note that the main scanning direction is the left-right direction in FIG. 17A, and the direction that is orthogonal to the main scanning direction and conforms to the circumference of the photoreceptor 1 is referred to as the sub scanning direction. The sub scanning direction width of the electrostatic latent images formed on the photosensitive members 1 corresponds to the number of times that the BD period in FIG. 16 is repeated. Returning to FIG. 16, when the formation of the electrostatic latent images ends at a time T4, the detection unit 108 samples the charging currents measured by the measurement circuit of the charging bias power supply 20 from a time T5 that is before the electrostatic latent images reach the position opposing the charging roller 2 to a time T6 that is after the electrostatic latent images have passed. When the sampling ends at the time T6, the engine control unit 102 stops the output of the charging bias, and then stops the rotation of the photosensitive members 1 at a time T7. The mounting determination unit 113 determines whether a cartridge 9 has a mounting fault based on the sampling values. Note that as will be described later, the charging current changes depending on whether or not the electrostatic latent image is at the position opposing the charging roller 2. For example, in the present embodiment, the average values of the sampling values in the respective states can be the values of the charging current in the states where the electrostatic latent image is respectively at and not at the position opposing the charging roller 2. Note that sampling values may be directly used instead of average values.

Figure 18A:
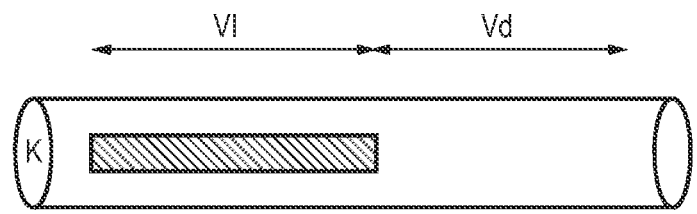
FIGS. 18A and 18B are diagrams respectively showing a photosensitive member having an electrostatic latent image formed thereon and a resistance model of the same according to an embodiment.
Figure 18B:
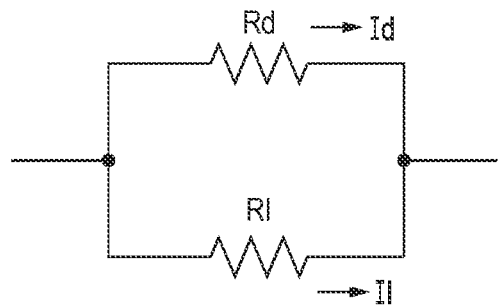

The following describes how the mounting determination unit 113 specifies whether a mounting fault has occurred and specifies the cartridge 9 with which the mounting fault occurred. As shown in FIG. 18A, Vd indicates the potential of the non-exposed region of the photosensitive member 1, and V1 indicates the potential of the exposed region. Here, the potential difference between the charging roller 2 and the exposed region of the photosensitive member 1 is higher than the potential difference between the charging roller 2 and the non-exposed region of the photosensitive member 1. Note that the value of the charging current increases as the potential difference between the charging roller 2 and the surface of the photosensitive member 1 increases. As shown in FIG. 18A, if the exposed region and the non-exposed region, that is to say regions in which the electrostatic latent image is respectively formed and not formed, are provided in the main scanning direction, the current value that flows in the region in which the electrostatic latent image is formed is higher than the region in which the electrostatic latent image is not provided. This can be modeled by a parallel connection between a virtual resistor Rd corresponding to the region of the photosensitive member 1 in which the electrostatic latent image is not formed and a virtual resistor Rl corresponding to the region in which the electrostatic latent image is formed, as shown in FIG. 18B. As clearly understood from FIG. 18B, the combined resistance value of the virtual resistors Rd and Rl changes according to the length of the electrostatic latent image in the main scanning direction.

Figure 17B:
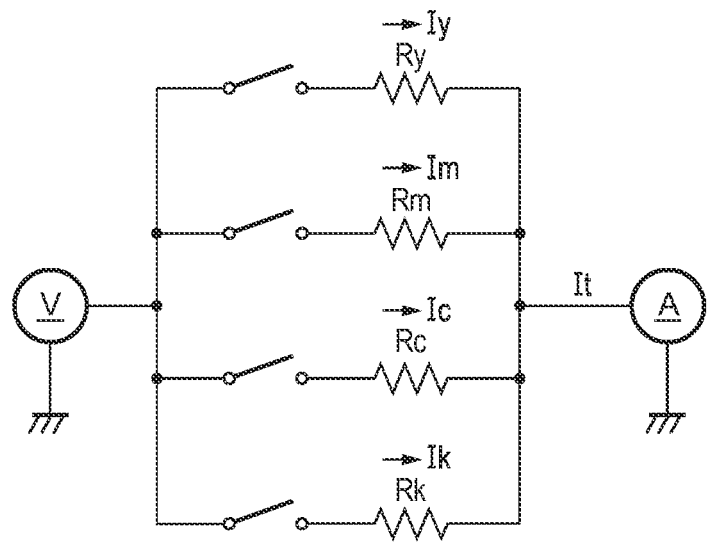

In the present embodiment, the main scanning direction length of the electrostatic latent image formed on the photosensitive member 1 is set differently for each of the photosensitive members 1, as shown in FIG. 17A. Accordingly, the virtual combined resistance values of the photosensitive members 1 are also different in the sub scanning direction range in which the electrostatic latent images are formed. Here, Ry, Rm, Rc, and Rk indicate the virtual combined resistance values in the sub scanning direction ranges in which the electrostatic latent images are formed on the photosensitive members 1a, 1b, 1c, and 1d respectively. FIG. 17B shows an equivalent circuit as viewed from the charging bias power supply 20 when the electrostatic latent image is at the position opposing the charging roller 2. Note that in FIG. 17B, Iy, Im, Ic, and Ik respectively indicate the charging current values of the photosensitive members 1a, 1b, 1c, and 1d when the electrostatic latent images formed thereon reach the position opposing the charging roller 2, and It indicates the total value of these charging current values. It should also be noted that the switches in FIG. 17B indicate the mounted states of the cartridges 9, where an off switch corresponds to a mounting fault of the cartridge 9, and an on switch corresponds to the state in which the cartridge 9 is mounted properly.

FIG. 19 shows the relationship between the mounted states of the cartridges 9 and the charging current flowing in the charging bias power supply 20 when the electrostatic latent images pass the position opposing the charging roller 2. Note that in FIG. 19, Ib indicates the current value flowing in the photosensitive member when the sub scanning direction range in which the electrostatic latent image is not formed on the photoreceptor 1 opposes the charging roller 2. In other words, Ib is the charging current value of the photosensitive member 1 before the electrostatic latent image formed on the photosensitive member 1 reaches the position opposing the charging roller 2 and after the electrostatic latent image passes the position opposing the charging roller 2. For example, in a state A in FIG. 19, all of the cartridges 9 are mounted properly, and therefore the total value of the charging currents before the electrostatic latent images reach the position opposing the charging roller 2 and after the electrostatic latent images pass the position opposing the charging roller 2 is 4Ib, which is four times the charging current Ib flowing in one photosensitive member 1. Also, the total value of the charging currents when the electrostatic latent images are at the position opposing the charging roller 2 is Iy+Im+Ic+Ik. Accordingly, the variation in the charging currents measured by the measurement circuit of the charging bias power supply 20 when the electrostatic latent image pass the position opposing the charging roller 2 is Iy+Im+Ic+Ik−4Ib.

FIG. 20 shows the relationship between the charging current and all of the combinations of the mounted states of the cartridges 9, which is stored in the RAM 109 or the ROM 110, for example. Note that electrostatic latent images are formed on the photosensitive members 1 such that the charging current Iy is the reference (value of "1"), and the charging currents Im, Ic, and Ik are respectively values of "2", "4", and "8". Note that the charging current Ib is the value of "0.5". In opposite terms, an electrostatic latent image is formed on the photosensitive member 1a such that the charging current in that region is twice the charging current in the region where the electrostatic latent image is not formed. The value of "0" in the Iy, Im, Ic, and Ik rows in the table in FIG. 20 indicates that the corresponding cartridge 9 is not mounted. Also, the numbers in the locations with values other than "0" indicate the value of the charging current flowing in the corresponding photosensitive member 1 when the electrostatic latent image is at the position opposing the charging roller 2. Also, the total value shown in FIG. 20 indicates the total value of the charging current values measured by the charging bias power supply 20 when the electrostatic latent images reached the position opposing the charging roller 2, that is to say the total value of Iy, Im, Ic, and Ik. Furthermore, the properly mounted number shown in FIG. 20 indicates the number of cartridges 9 that are properly mounted, and "total Ib" indicates the total value of the charging current flowing in charging bias power supply 20 before the electrostatic latent images formed on the photosensitive members 1 reach the position opposing the charging roller 2 and after they have passed. Moreover, the variation shown in FIG. 20 indicates the difference between the "total value" and the "total Ib", that is to say, the amount of change in the charging current that occurs due to the electrostatic latent image being formed on the photosensitive member 1 and passing the position opposing the charging roller 2. Note that labels have been given to identify the respective mounted states.

For example, the state with label #4 corresponds to the state in which only the two yellow and magenta cartridges 9 are properly mounted. Accordingly, Iy and Im flow in the photosensitive members 1a and 1b when the electrostatic latent images reach the position opposing the charging roller 2, and therefore the charging current flowing in the charging bias power supply 20 has a value of "3". Before the electrostatic latent images reach the position opposing the charging roller 2 and after they have passed, the current Ib=0.5 flows in the two photosensitive members 1a and 1b, and therefore the charging current flowing in the charging bias power supply 20 has a value of "1". Accordingly, in this case, the charging current flowing in the charging bias power supply 20 changes by the value "2" due to rotating the photosensitive members 1. As clearly understood from FIG. 20, the variation between the total value of the charging currents when the electrostatic latent images are at the position opposing the charging roller 2 and the total value of the charging currents when the electrostatic latent images have passed the position opposing the charging roller 2 is different for each combination of mounted states of the cartridges 9. Also, the total value of the charging currents when the electrostatic latent images are at the position opposing the charging roller 2 is different for each combination of mounted states of the cartridges 9. Accordingly, the mounting determination unit 113 can specify the cartridges 9 that have a mounting fault based on the value of the charging current output by the charging bias power supply 20 or the variation thereof.

As described above, by appropriately setting different main scanning direction lengths for the electrostatic latent images formed on the photosensitive members 1, it is possible to specify which cartridges 9 have a mounting fault based on the value of the charging current or the variation thereof. In the present embodiment, even if the electrostatic latent images are formed such that the electrostatic latent images formed on the photosensitive members 1 pass the position opposing the charging roller 2 at the same timing, it is possible to correctly specify a cartridge 9 that has a mounting fault based on the total value of the charging currents of the photosensitive members 1. Note that the electrostatic latent images may be formed such that the electrostatic latent images formed on the photosensitive members 1 pass the position opposing the charging roller 2 at mutually different timings, for example. In this configuration as well, there is no need to switch the charging roller 2 that receives a voltage from the charging bias power supply 20, and the mounted state of the cartridges 9 can be determined in a short period of time. However, if the electrostatic latent images are formed such that the electrostatic latent images formed on at least two photosensitive members 1 pass the position opposing the charging roller 2 at the same timing, it is possible to determine the mounted states in a shorter period of time. Furthermore, if the electrostatic latent images are formed such that the electrostatic latent images formed on all of the photosensitive members 1 pass the position opposing the charging roller 2 at the same timing as described in the present embodiment, it is possible to determine the mounted states in an even shorter period of time.

Note that as previously described, in the present embodiment, the cartridges 9 have the same configuration with the exception of the color of developer used. Accordingly, if overlapping periods are set for the periods in which electrostatic latent images are formed on at least two photosensitive members 1, the electrostatic latent images formed on at least two photosensitive members 1 will pass the position opposing the charging roller 2 at the same timing. Similarly, if overlapping periods are set for the periods in which the electrostatic latent images are formed on all of the photosensitive members 1, the electrostatic latent images formed on all of the photosensitive members 1 will pass the position opposing the charging roller 2 at the same timing.

Also, although the lengths of the electrostatic latent images in the main scanning direction are set longer in the order of the photosensitive members 1a, 1b, 1c, and 1d in the present embodiment, the correspondence relationship between the length of the electrostatic latent image in the main scanning direction and the photosensitive members 1 can be determined as necessary. Furthermore, the main scanning direction lengths of the electrostatic latent images formed on the photosensitive members 1 can be set differently each time the mounting determination processing is performed. For example, the exposure time management unit 112 can manage the cumulative value of the exposure time in each of the photosensitive members 1, and form an electrostatic latent image with a shorter main scanning direction length the higher the cumulative value of the exposure time is in the corresponding photosensitive member 1. According to this configuration, it is possible to equalize the degree of degradation of the exposure units 11 and the photosensitive members 1. Note that instead of the cumulative value of the exposure time, another value indicating usage amounts of the exposure units 11 and the photosensitive members 1 can be used.

Figure 21:
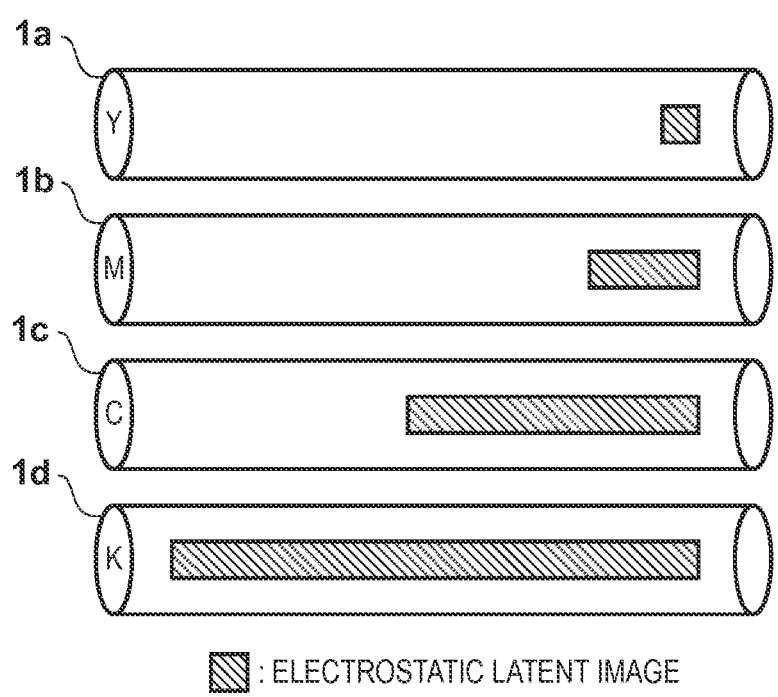
FIG. 21 is a diagram showing electrostatic latent images formed in mounting determination processing according to an embodiment.

Note that although the electrostatic latent images are formed with predetermined lengths in the main scanning direction from the scan start position of the photosensitive members 1 in FIG. 17A, the positions at which the electrostatic latent images are formed are not limited to the positions shown in FIG. 17A. For example, as shown in FIG. 21, the electrostatic latent images can be formed with predetermined lengths in the main scanning direction from the scan end position of the photosensitive members 1. Furthermore, the electrostatic latent images can be formed such that the non-exposed region is provided at both ends of each of the photosensitive members 1 in the main scanning direction. Moreover, there is no need for the positions where the electrostatic latent images are formed on the photosensitive members 1 to be the same, and the position may be set differently for each photosensitive member 1, for example. Also, in the image forming apparatus shown in FIG. 1, the charging bias power supply 20 applies the charging bias to all of the charging rollers 2a, 2b, 2c, and 2d. However, the present embodiment and the above-described embodiments can be applied to an image forming apparatus having any configuration that includes one or more charging bias power supplies 20 that apply a charging bias to a plurality of charging rollers 2. For example, a configuration is possible in which two charging bias power supplies 20 are provided, and the charging bias power supplies 20 respectively supply charging bias voltages to two charging rollers 2. Note that since the mounted states of the cartridges 9 are determined based on the charging current in the present embodiment, similarly to the developing bias power supply 21, the primary transfer bias power supply 84 may be provided separately for each primary transfer roller 81, and the measurement circuit may be omitted. Note that in the present embodiment as well, the determination can be made based on the transfer current or the developing current instead of the charging current.

Fifth Embodiment

In the present embodiment, two electrostatic latent images having different lengths in the main scanning direction are formed on each of the photosensitive members 1. The present embodiment will be described below focusing on differences from the fourth embodiment.

Figure 22:
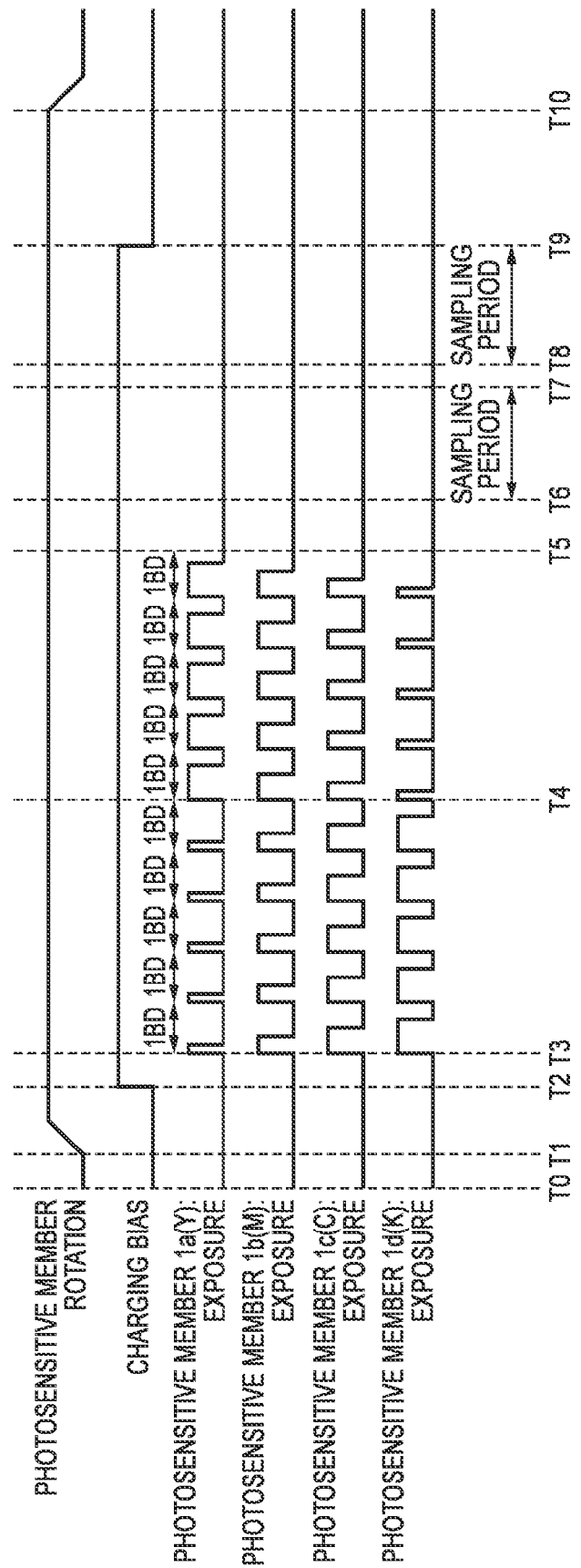
FIG. 22 is a timing chart for mounting determination processing according to an embodiment.
Figure 23:
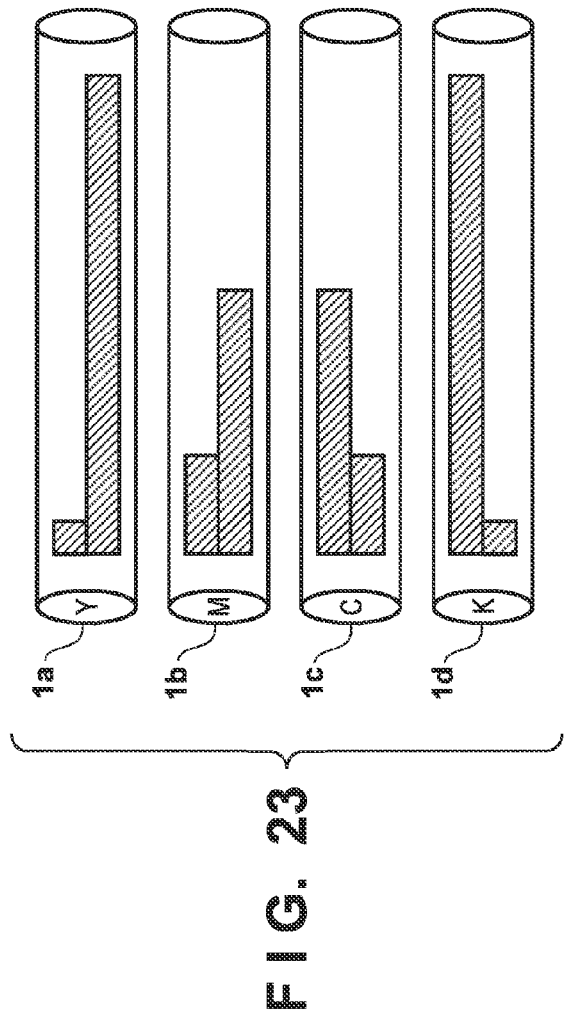
FIG. 23 is a diagram showing electrostatic latent images formed in mounting determination processing according to an embodiment.

FIG. 22 is a timing chart for mounting determination processing according to the present embodiment. The engine control unit 102 starts the mounting determination processing at a time T0, and then rotates the photosensitive members 1 at a time T1. After the rotation of the photosensitive members 1 has stabilized, the engine control unit 102 outputs the charging bias to the photosensitive members 1 at a time T2. When the charged portions of the photosensitive members 1 reach the exposure position at a time T3, the formation unit 106 of the engine control unit 102 forms electrostatic latent images by exposing the surfaces of the photosensitive members 1. As shown in FIG. 22, the photosensitive members 1 are exposed by switching between an exposed portion that is exposed and a masked portion that is not exposed with the period with which one scan line is scanned (BD period). Note that as shown in FIG. 22, the length of the exposed portion in the main scanning direction increases in the order of the photosensitive member 1a, the photosensitive member 1b, the photosensitive member 1c, and then the photosensitive member 1d. Thereafter, the formation unit 106 changes the lengths of the exposed portions and the masked portions of the photosensitive members 1 at a time T4. As shown in FIG. 22, unlike the period from the time T3 to the time T4, the length of the exposed portion in the main scanning direction decreases in the order of the photosensitive member 1a, the photosensitive member 1b, the photosensitive member 1c, and then the photosensitive member 1d. Accordingly, as shown in FIG. 23, two rectangular electrostatic latent images having different lengths in the main scanning direction are formed side-by-side in the sub scanning direction on each of the photosensitive members 1. Thereafter, the detection unit 108 of the engine control unit 102 samples the charging currents in the period from the time T6 to the time T7 and in the period from a time T8 to a time T9. Note that the period from the time T6 to the time T7 includes the period in which the electrostatic latent images formed between the time T3 and the time T4 (referred to hereinafter as the first electrostatic latent images) are at the position opposing the charging roller 2, and the period from the time T8 to the time T9 includes the period in which the electrostatic latent images formed between the time T4 and the time T5 (referred to hereinafter as the second electrostatic latent images) are at the position opposing the charging roller 2. When the sampling ends at the time T9, the engine control unit 102 stops the output of the charging bias, and then stops the rotation of the photosensitive members 1 at a time T10.

Figure 24:
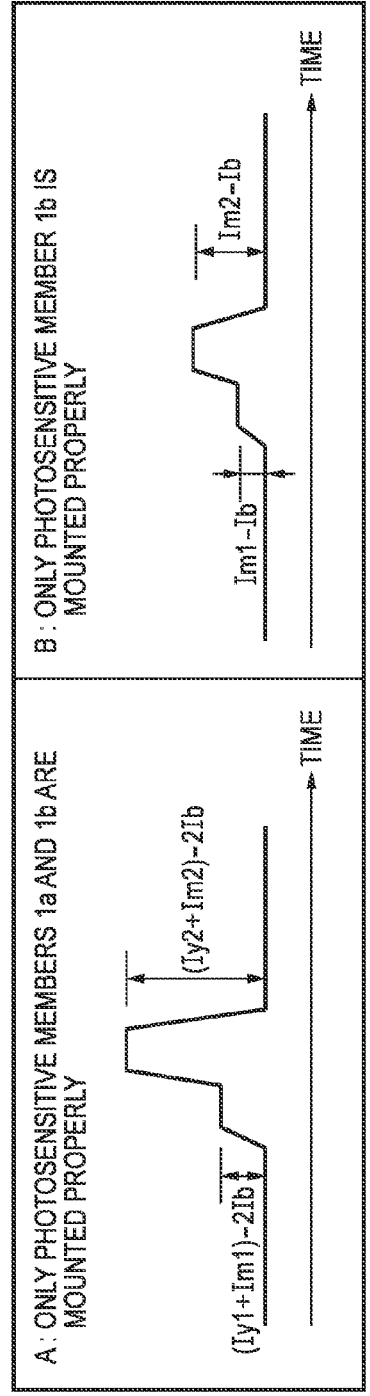
FIG. 24 is a diagram illustrating change in charging current when electrostatic latent images pass a position opposing a charging roller according to an embodiment.

FIG. 24 shows change in the charging current flowing in the charging bias power supply 20 in the present embodiment. Note that in FIG. 24, the current value Ib is the value of the charging current flowing in a photosensitive member 1 in the case where an electrostatic latent image has not been formed on that photosensitive member 1. Also, Iy1 indicates the value of the charging current of the photosensitive member 1a when the first electrostatic latent image is at the position opposing the charging roller 2a, and Iy2 indicates the value of the charging current of the photosensitive member 1a when the second electrostatic latent image is at the position opposing the charging roller 2a. Similarly, Im1 indicates the value of the charging current of the photosensitive member 1b when the first electrostatic latent image is at the position opposing the charging roller 2b, and Im2 indicates the value of the charging current of the photosensitive member 1b when the second electrostatic latent image is at the position opposing the charging roller 2b.

Assume that the values of the charging current flowing in the photosensitive members 1 for the first electrostatic latent image are the same as in the first embodiment, for example. In this case, the relationship between the charging current for the first electrostatic latent image and all of the combinations of the mounted states of the cartridges 9 is the same as the relationship shown in FIG. 20. Note that Iy, Im, Ic, and Ik in FIG. 20 are respectively replaced with Iy1, Im1, Ic1, and Ik1 in this case. On the other hand, the values of the charging currents Iy2, Im2, Ic2, and Ik2 of the photosensitive members 1 with respect to the second electrostatic latent image are respectively 8 times, 4 times, 2 times, and 1 times the value of Iy1. In this case, the relationship between the charging current for the second electrostatic latent image and all of the combinations of the mounted states of the cartridges 9 is shown in FIG. 25.

For example, consider the state with the label #4 in FIGS. 20 and 25, in which only the yellow and magenta cartridges 9 are mounted properly. Furthermore, assume that noise is generated while the electrostatic latent images pass the position opposing the charging roller 2, and a value reduced by "0.3" is detected for the charging current flowing in the charging bias power supply 20. In this case, the variation in the charging current caused by the first electrostatic latent image is "1.7" due to the influence of the noise. The difference between the value "1.7" and the variation in the state with the label #3 is "0.2", and the difference between the value "1.7" and the variation in the state with the label #4 is "0.3". Accordingly, if the mounted state is determined using only the detection of the first electrostatic latent image, the mounting determination unit 113 will determine that the state is the state with the label #3, that is to say, only the cartridge 9 corresponding to magenta is mounted properly. The second electrostatic latent image is formed as well in the present embodiment for this reason. In this example, the variation in the charging current caused by the second electrostatic latent image is "10.7" due to the influence of the noise. The difference between the value "10.7" and the variation in the state with the label #3 is "7.2", and the difference between the value "10.7" and the variation in the state with the label #4 is "0.3". Accordingly, based on the two variations, the mounting determination unit 113 can correctly determine that the state is not the state with the label #3, but rather the state with the label #4, that is to say, only the yellow and magenta cartridges 9 are mounted properly.

Note that although an electrostatic latent image is formed two times in the present embodiment, more generally, a configuration is possible in which an electrostatic latent image is formed multiple times (N times, where N is an integer greater than or equal to 2) on each photosensitive member 1. Here, the main scanning direction lengths of four electrostatic latent images formed on each photosensitive member 1 at the K-th time (K being an integer from 1 to N) are set differently each other. Also, the correspondence relationship between the photosensitive members 1 and the main scanning direction lengths of the four electrostatic latent images formed each time is set differently each time electrostatic latent image formation is performed. According to this configuration, it is possible to suppress erroneous detection caused by noise, and raise the mounted state determination accuracy. Note that a configuration is possible in which the correspondence relationship between the photosensitive members 1 and the main scanning direction lengths of the four electrostatic latent images formed each time is set differently at least one time among the N times.

Note that in the present embodiment as well, similarly to the first embodiment, the mounted state can be determined using the transfer current or the developing current instead of the charging current. Furthermore, the mounted state can be determined based on the absolute value of the charging current when the electrostatic latent image is detected, instead of the variation.

Sixth Embodiment

Next, a sixth embodiment will be described focusing on differences from the fourth embodiment. In the present embodiment, determination ranges are provided for the variation in the charging current shown in FIG. 20, and if the detected variation is within a certain determination range, the state is determined to the corresponding mounted state. FIG. 26 shows determination ranges for respective mounted states, which are stored in the RAM 109 or the ROM 110, for example. Note that FIG. 26 is the same as FIG. 20 with the exception of the addition of the determination ranges. In this example, the lower limit value and the upper limit value of the determination range are respectively obtained by the following equations.

lower limit value=$St-(St-Sl)/5$ upper limit value=$St+(Su-St)/5$

Here, St is the variation of the target mounted state in the calculation. Also, Sl is the variation of another mounted state that is lower than and the closest to the variation of the target mounted state in the calculation. Furthermore, Su is the variation of another mounted state that is higher than and the closest to the variation of the target mounted state in the calculation. For example, in the case of the mounted state with the label #4, St=2, Sl=1.5, and Su=3.5, and therefore the lower limit value and the upper limit value are respectively 1.9 and 2.3. Note that the upper limit value and the lower limit value obtained by the above calculation equations are illustrative examples, and it is possible to use any values that do not result in overlapping ranges.

For example, assume the mounted state with the label #2, and assume that the variation in the current caused by the influence of noise when the electrostatic latent image is detected increases by 0.3. In this case, the engine control unit 102 detects "0.8" as the variation in the current, which is not included in any of the ranges. Note that since the detected value is a value between the determination range with the label #2 and the determination range with the label #3, the engine control unit 102 can determine that the cyan and black cartridges 9 have a mounting fault. This is because the cyan and black cartridges 9 have a mounting fault in both of the states with the labels #2 and #3. However, the mounted states of the magenta and yellow cartridges 9 are different in the states with the labels #2 and #3, and therefore the engine control unit 102 cannot specify the mounted state for the yellow and magenta cartridges 9.

Figures 27, 28:
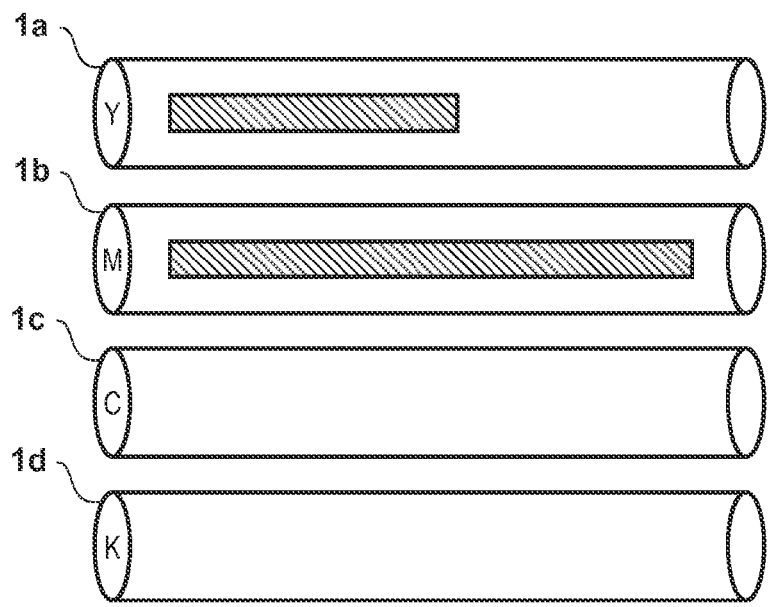
FIG. 27 is a diagram showing electrostatic latent images formed in mounting determination processing according to an embodiment.
FIG. 28 is a diagram showing a relationship between cartridge mounted states and charging current according to an embodiment.

For this reason, the yellow and magenta cartridges 9 whose state could not be determined are subjected to re-determination by the engine control unit 102. Note that if the number of photosensitive members 1 on which the electrostatic latent image is to be formed has decreased due to the previous determination result, the engine control unit 102 performs control such that the difference between the main scanning direction lengths of the electrostatic latent images formed on the photosensitive members 1 is greater than the previous time. FIG. 27 shows the electrostatic latent images that are formed the second time in this example. In comparison with the electrostatic latent images shown in FIG. 17A that are formed the first time, the main scanning direction lengths of the electrostatic latent images formed on the photosensitive members 1$a$ and 1$b$ are each longer. Setting different extents of increase at this time increases the difference between the main scanning direction lengths of the electrostatic latent images formed on the photosensitive members 1$a$ and 1$b$. This is done in order to increase the difference between the charging currents of the photoreceptors 1 when detecting the electrostatic latent images, so as to raise the detection accuracy. For example, in FIG. 27, electrostatic latent images are formed such that the charging current Iy of the photosensitive member 1$a$ is four times the charging current Iy in the first time, and such that the charging current Im of the photosensitive member 1$b$ is eight times the charging current Iy in the first time.

FIG. 28 shows the relationship between the charging current value and mounted states in the case of forming electrostatic latent images as shown in FIG. 27. In this example, the yellow cartridge 9 is mounted properly, and therefore if the variation increases by "0.3" similarly to the first time, the detected variation is "3.8". Accordingly, it can be determined that the yellow cartridge 9 is mounted properly, and that the magenta cartridge 9 has a mounting fault. Note that in the present embodiment as well, similarly to the above embodiments, the determination can be made based on the absolute value of the charging current when the electrostatic latent image is at the position opposing the charging roller 2, instead of the variation. Also, the determination can be made using the transfer current or the developing current instead of the charging current.

As described above, determination ranges are provided for values related to current that correspond to mounting fault states, and if the detected value is within a certain range, the state is determined to the corresponding mounted state. Also, if the detected value is not within any of the ranges, a determination is made for the cartridges 9 whose mounted state can be specified, and re-determination is performed for the cartridges 9 for which the mounted state could not be determined to be proper of faulty. Specifically, if the detected value is not within any of the ranges, the mounting determination unit 113 determines a first range whose upper limit value is the closest to the detected value, and a second range whose lower limit value is the closest to the detected value. The mounting determination unit 113 then determines that a cartridge 9 whose mounted state is the same in the first range and the second range is in the mounted state corresponding to the first range and the second range. However, a cartridge 9 whose mounted state is different in the first range and the second range is determined to be a cartridge 9 whose mounted state cannot be determined.

Then, in the case of performing re-determination on some of the cartridges 9, an electrostatic latent image with a main scanning direction length that is different from the previous time is formed on at least one of the photosensitive members 1 of the cartridges subjected to re-determination. According to this configuration, it is possible to suppress the influence of noise and correctly determine the mounted states of the cartridges 9. Furthermore, in the case of performing re-determination on at least two cartridges 9, electrostatic latent images are formed such that the difference between the main scanning direction lengths of the electrostatic latent images formed on the photosensitive members 1 of the cartridges 9 subjected to re-determination is higher than the difference in the previous time. According to this configuration, it is possible to suppress the influence of noise and correctly determine the mounted states of the cartridges 9.

Other Embodiments

Embodiments of the present invention can also be realized by a computer of a system or apparatus that reads out and executes computer executable instructions (e.g., one or more programs) recorded on a storage medium (which may also be referred to more fully as a "non-transitory computer-readable storage medium") to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-017736, filed Jan. 31, 2014, and Japanese Patent Application No. 2014-017737, filed Jan. 31, 2014, which are hereby incorporated by reference herein in their entirety.

What is claimed is:

1. An image forming apparatus comprising:
a plurality of image forming units that are each configured to be detachably mountable and include an image carrier that is driven to rotate;
a light irradiation unit configured to irradiate respective image carriers of the plurality of image forming units with light to form one or more electrostatic latent images along a direction of the rotational driving;
a detection unit configured to detect the one or more electrostatic latent images;
a determination unit configured to determine mounted states of the plurality of image forming units based on a detection result obtained by the detection unit; and
a control unit configured to perform control such that, for each of the image carriers, the one or more electrostatic latent images are not formed on an image carrier in a period in which at least one of the one or more electrostatic latent images is formed on a different image carrier.

2. The image forming apparatus according to claim 1, wherein the determination unit is further configured to determine the mounted states of the plurality of image forming units based on a number of times values detected by the detection unit rose above a threshold value or fell below a threshold value.

3. The image forming apparatus according to claim 1, wherein the determination unit is further configured to determine the mounted states of the plurality of image forming units by performing frequency analysis on values detected by the detection unit.

4. The image forming apparatus according to claim 1, wherein the detection unit is further configured to detect output values via a charging unit that charges the image carrier, detect output values via a transfer unit that transfers a developer image formed on the image carrier to a transfer receiver, or detect output values via a developing unit that develops an electrostatic latent image formed on the image carrier as a developer image.

5. The image forming apparatus according to claim 1, further comprising a correction unit configured to perform misregistration correction based on timings at which the detection unit detects the electrostatic latent images.

6. An image forming apparatus comprising:
a plurality of image forming units that are each configured to be detachably mountable and include an image carrier that is driven to rotate;
a light irradiation unit configured to irradiate respective image carriers of the plurality of image forming units with light to form one or more electrostatic latent images along a direction of the rotational driving;
a detection unit configured to detect the one or more electrostatic latent images;
a determination unit configured to determine mounted states of the plurality of image forming units based on a detection result obtained by the detection unit; and
a control unit configured to perform control such that, for each of the image carriers, the one or more electrostatic latent images formed on an image carrier are not detected by the detection unit in a period in which at least one of the one or more electrostatic latent images formed on a different image carrier is detected by the detection unit.

7. An image forming apparatus comprising:
a plurality of image forming units that are each configured to be detachably mountable and include an image carrier that is driven to rotate;
a light irradiation unit configured to irradiate respective image carriers of the plurality of image forming units with light to form a plurality of electrostatic latent images along a direction of the rotational driving;
a detection unit configured to detect the plurality of electrostatic latent images;
a determination unit configured to determine mounted states of the plurality of image forming units based on a detection result obtained by the detection unit; and
a control unit configured to perform control such that, for each of the image carriers, the plurality of electrostatic latent images are not formed on an image carrier in a period in which at least two consecutive electrostatic latent images among the plurality of electrostatic latent images are formed on a different image carrier.

8. The image forming apparatus according to claim 7, wherein the determination unit is further configured to determine the mounted states of the plurality of image forming units by performing frequency analysis on values detected by the detection unit.

9. The image forming apparatus according to claim 8, wherein the light irradiation unit is further configured to form the plurality of electrostatic latent images on respective image carriers with a predetermined period, and
the determination unit is further configured to determine the mounted states of the plurality of image forming units based on frequency values corresponding to the predetermined period in a result of the frequency analysis performed on the values detected by the detection unit.

10. An image forming apparatus comprising:
a plurality of image forming units that are each configured to be detachably mountable and include an image carrier that is driven to rotate;
a light irradiation unit configured to irradiate respective image carriers of the plurality of image forming units with light to form a plurality of electrostatic latent images along a direction of the rotational driving;
a detection unit configured to detect the plurality of electrostatic latent images;
a determination unit configured to determine mounted states of the plurality of image forming units based on a detection result obtained by the detection unit; and
a control unit configured to perform control such that, for each of the image carriers, the plurality of electrostatic latent images formed on an image carrier are not detected by the detection unit in a period in which at least two consecutive electrostatic latent images among the plurality of electrostatic latent images formed on a different image carrier are detected by the detection unit.

11. An image forming apparatus comprising:
a plurality of image forming units that are each configured to be detachably mountable and include an image carrier that is driven to rotate;
a light irradiation unit configured to irradiate respective image carriers of the plurality of image forming units with light to form a plurality of electrostatic latent images along a direction of the rotational driving;
a detection unit configured to detect the plurality of electrostatic latent images;
a determination unit configured to determine mounted states of the plurality of image forming units based on a detection result obtained by the detection unit; and
a control unit configured to perform control such that a period of the plurality of electrostatic latent images formed on each of the image carriers is different for each of the image carriers,
wherein the determination unit is further configured to determine the mounted states of the plurality of image forming units by performing frequency analysis on the detection result.

12. The image forming apparatus according to claim 11, wherein overlapping periods exist among periods in which the light irradiation unit forms the plurality of electrostatic latent images on at least two image carriers among the image carriers.

13. The image forming apparatus according to claim 11, further comprising a power supply unit configured to, for each output member that outputs a bias for image formation to a respective image carrier, supply the bias to the output member,
wherein the light irradiation unit is further configured to form the plurality of electrostatic latent images on respective image carriers such that overlapping periods exist among periods in which the plurality of electrostatic latent images formed on at least two image carriers among the image carriers pass a position opposing the corresponding output member.

14. The image forming apparatus according to claim 11, wherein the determination unit is further configured to determine the mounted states of the plurality of image forming units based on frequency values corresponding to the periods of the plurality of electrostatic latent images formed on the image carriers in a result of the frequency analysis performed on the values detected by the detection unit.

15. The image forming apparatus according to claim 11, wherein the control unit is further configured to perform control such that, for each of the image carriers, a frequency corresponding to the period of the plurality of electrostatic latent images formed on an image carrier is not a harmonic frequency of a frequency corresponding to the period of the plurality of electrostatic latent images formed on another image carrier.

16. An image forming apparatus comprising:
a plurality of image forming units that are each configured to be detachably mountable and include an image carrier that is driven to rotate;
a light irradiation unit configured to irradiate respective image carriers of the plurality of image forming units with light to form an electrostatic latent image;
a detection unit configured to detect electrostatic latent images;
a determination unit configured to determine mounted states of the plurality of image forming units based on a detection result obtained by the detection unit; and
a control unit configured to perform control such that main scanning direction lengths of the electrostatic latent images formed on the image carriers are different from each other.

17. The image forming apparatus according to claim 16, further comprising a power supply unit configured to, for each output member that outputs a bias for image formation to a respective image carrier, supply the bias to the output member,
wherein the detection unit is further configured to detect a variation in current or voltage output by the power supply unit, or detect a value of current or voltage output by the power supply unit.

18. The image forming apparatus according to claim 17, wherein the light irradiation unit is further configured to form an electrostatic latent image on respective image carriers such that electrostatic latent images formed on at least two of the image carriers pass positions opposing the output members at the same timing.

19. The image forming apparatus according to claim 16, wherein overlapping periods exist among periods in which the light irradiation unit forms an electrostatic latent image on at least two image carriers among the plurality of image forming units.

20. The image forming apparatus according to claim 16, further comprising a management unit configured to manage usage amounts of the image carriers or exposure units that expose the image carriers,
wherein the control unit is further configured to, for each of the image carriers, determine a main scanning direction length of an electrostatic latent image formed on the image carrier based on the usage amount of the image carrier or the exposure unit corresponding to the image carrier.

21. The image forming apparatus according to claim 20, wherein the control unit is further configured to, for each of the image carriers, reduce the main scanning direction length of the electrostatic latent image to be formed on the image carrier as the usage amount of the image carrier or the exposure unit corresponding to the image carrier increases.

22. The image forming apparatus according to claim 20, wherein the management unit is further configured to, for each of the image carriers, manage a cumulative value of exposure times of the image carrier as the usage amount.

23. The image forming apparatus according to claim 16, wherein if the determination unit cannot determine the mounted state of a portion of image forming units among the plurality of image forming units based on the detection result obtained by the detection unit,
the control unit is further configured to cause the light irradiation unit to form electrostatic latent images having different main scanning direction lengths on respective image carriers of the portion of image forming units whose mounted state could not be determined, and
the determination unit is further configured to determine the mounted state of the portion of image forming units whose mounted state could not be determined, based on a detection result obtained by the detection unit after forming the electrostatic latent images on the image carriers of the portion of image forming units whose mounted state could not be determined.

24. The image forming apparatus according to claim 23, wherein the control unit is further configured to perform control such that the main scanning direction lengths of the electrostatic latent images formed on at least one image carrier out of the portion of image forming units are different from the main scanning direction lengths of the electrostatic latent images previously formed on the at least one image carrier.

25. The image forming apparatus according to claim 23, wherein the control unit is further configured to perform control such that, if the portion of image forming units includes at least two image forming units, a difference between the main scanning direction lengths of the electrostatic latent images formed on the carriers of the at least two image forming units is higher than a difference between the main scanning direction lengths of the electrostatic latent images previously formed on the image carriers.

26. The image forming apparatus according to claim 23, further comprising a holding unit configured to hold information indicating a relationship between combinations of mounted states of the plurality of image forming units and ranges of values detected by the detection unit,
wherein the determination unit is further configured to, if a value detected by the detection unit is not within any of the ranges of values stored by the holding unit, determine a first range whose upper limit value is closest to the value detected by the detection unit and a second range whose lower limit value is closest to the value detected by the detection unit, and determine that an image forming unit whose mounted states in the first range and the second range are different is an image forming unit whose mounted state cannot be determined.

27. The image forming apparatus according to claim 16,
wherein the light irradiation unit is further configured to form an electrostatic latent image a plurality of times on respective image carriers, and
the control unit is further configured to perform control such that, for each of the image carriers, a main scanning direction length of the electrostatic latent image formed on the image carrier is different in each of the plurality of times.

28. The image forming apparatus according to claim 27, wherein the control unit is further configured to perform control such that a correspondence relationship between the image carriers and main scanning direction lengths of electrostatic latent images formed on the image carriers is different at least one time among the plurality of times.

29. The image forming apparatus according to claim 16, further comprising a correction unit configured to perform misregistration correction based on timings at which the detection unit detects the electrostatic latent images.

30. An image forming apparatus comprising:
an image forming unit including an image carrier that is driven to rotate;
a light irradiation unit configured to irradiate the image carrier of the image forming unit with light to form an electrostatic latent image;
a detection unit configured to detect the electrostatic latent image; and
a determination unit configured to determine a mounted state of the image forming unit based on a detection result obtained by the detection unit.

* * * * *